(12) United States Patent
Shi et al.

(10) Patent No.: US 10,986,712 B2
(45) Date of Patent: Apr. 20, 2021

(54) CONTROLLABLE DRIVER AND DRIVE METHOD TO CONNECT AN ELECTRONIC BALLAST TO AN LED LIGHT SOURCE BASED ON THE MODEL, TYPE, OR IDENTITY OF THE BALLAST

(71) Applicant: SIGNIFY HOLDING B.V., Eindhoven (NL)

(72) Inventors: Liang Shi, Shanghai (CN); Adrianus Johannes Stephanus Maria De Vaan, S-Hertogenbosch (NL); Pieter Johannes Stobbelaar, Eindhoven (NL); Xianhui Zhang, Shanghai (CN); Paul Robert Veldman, Oss (NL); Hui Zheng, Eindhoven (NL); Gang Wang, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/651,103

(22) PCT Filed: Sep. 25, 2018

(86) PCT No.: PCT/EP2018/075846
§ 371 (c)(1),
(2) Date: Mar. 26, 2020

(87) PCT Pub. No.: WO2019/063497
PCT Pub. Date: Apr. 4, 2019

(65) Prior Publication Data
US 2020/0236761 A1    Jul. 23, 2020

(30) Foreign Application Priority Data

Sep. 30, 2017  (WO) ............... PCT/CN2017/105067
Nov. 22, 2017  (EP) .................................... 17203006
Nov. 22, 2017  (EP) .................................... 17203045

(51) Int. Cl.
*H05B 45/325*    (2020.01)
*H03F 1/02*    (2006.01)
(Continued)

(52) U.S. Cl.
CPC ............ *H05B 45/325* (2020.01); *H03F 1/02* (2013.01); *H03F 1/56* (2013.01); *H03F 3/45* (2013.01)

(58) Field of Classification Search
CPC ...... H05B 45/00; H05B 45/325; H05B 33/08; H03F 1/02; H03F 1/56; H03F 3/45
See application file for complete search history.

(56) References Cited

U.S. PATENT DOCUMENTS 4,095,175 A    6/1978  Paget
4,695,803 A    9/1987  Rue
(Continued)

FOREIGN PATENT DOCUMENTS

JP    2008236915 A    10/2008

*Primary Examiner* — Borna Alaeddini
(74) *Attorney, Agent, or Firm* — Daniel J. Piotrowski

(57) ABSTRACT

A control circuit, of a control loop, for a lighting driver. The lighting driver is adapted to controllably connect an electronic ballast to an LED light source or lamp. The control circuit comprises a biasing circuit having an adjustable impedance. A tuning circuit adjusts the impedance of the biasing circuit so as to tune a parameter of a frequency response of the control loop and thereby of the lighting driver.

15 Claims, 8 Drawing Sheets

(51) Int. Cl.
*H03F 1/56* (2006.01)
*H03F 3/45* (2006.01)

(56) References Cited

U.S. PATENT DOCUMENTS

| | | | |
|---|---|---|---|
| 5,708,376 A * | 1/1998 | Ikeda | H03F 1/086 |
| | | | 327/337 |
| 2003/0137344 A1 | 7/2003 | Kimball et al. | |
| 2010/0181925 A1 | 7/2010 | Ivey et al. | |
| 2011/0031419 A1* | 2/2011 | Fukui | G01N 21/4738 |
| | | | 250/574 |
| 2012/0013351 A1* | 1/2012 | Daniel | H03F 3/45475 |
| | | | 324/602 |
| 2012/0306403 A1 | 12/2012 | Chung et al. | |
| 2013/0320869 A1 | 12/2013 | Jans et al. | |
| 2014/0077722 A1 | 3/2014 | Takacs et al. | |
| 2014/0203716 A1 | 7/2014 | Tao | |
| 2014/0204571 A1 | 7/2014 | Zhang et al. | |
| 2014/0239832 A1 | 8/2014 | Shteynberg et al. | |
| 2014/0375227 A1 | 12/2014 | Yoshinaga | |
| 2016/0109070 A1 | 4/2016 | Davenport et al. | |
| 2017/0013688 A1 | 1/2017 | Hsia | |
| 2017/0024505 A1* | 1/2017 | Pam | G06F 30/30 |

* cited by examiner

CONTROLLABLE DRIVER AND DRIVE METHOD TO CONNECT AN ELECTRONIC BALLAST TO AN LED LIGHT SOURCE BASED ON THE MODEL, TYPE, OR IDENTITY OF THE BALLAST

CROSS-REFERENCE TO PRIOR APPLICATIONS

This application is the U.S. National Phase application under 35 U.S.C. § 371 of International Application No. PCT/EP2018/075846, filed on Sep. 25, 2018, which claims the benefit of International Application No. PCT/CN2017/105067, filed on Sep. 30, 2017, which claims the benefit of European Patent Application No. 17203006.6, filed on Nov. 22, 2017 and European Patent Application No. 17203045.4, filed on Nov. 22, 2017. These applications are hereby incorporated by reference herein.

FIELD OF THE INVENTION

This invention relates to the field of control circuits for lighting drivers of an LED light source.

BACKGROUND OF THE INVENTION

There has been an increasing trend in the use of retrofit LED lamps or light sources capable of replacing existing lamps, such as fluorescent or halogen lamps, in conventional lighting fixtures. Typically, conventional lighting fixtures comprise an electronic or magnetic ballast for appropriately driving a lamp in order to regulate the current flow therein.

A retrofit LED lamp therefore requires a driver circuit to convert the output of the electronic ballast to a form suitable for driving the LED lamp. Thus, a typical retrofit LED lighting arrangement comprises a lighting driver and an LED lamp or light source. However, there are a wide variety of different types or models of electronic ballasts, which are each associated with outputs of differing frequencies and having different ranges of magnitude. Compatibility of a retrofit LED lighting arrangement, and lighting drivers in particular, with such a wide range of electronic ballasts has been an increasingly recognized problem. Note that the electronic ballast is well known device in the art so as to drive discharge lamps, like tubular lamps, such as fluorescent lamp, or high intensity discharge (HID) lamp.

This compatibility issue is of marked significance when there is a desire to dim a light source or place the light source in a standby working status, as this leads to unpredictable behavior of the electronic ballast. In particular, "flicker" or fluctuations in light output by the LED lamp occur when the LED light arrangement is incompatible with an electronic ballast (e.g. at a particular dimming level).

US20140375227A1 discloses a flyback converter to drive LED group from an AC input, and said flyback converter comprises an error amplifier. U.S. Pat. No. 5,708,376A1 discloses a variable-gain amplifying device to secure a phase margin to prevent oscillation.

SUMMARY OF THE INVENTION

One key cause of this incompatibility, found by the inventors, is a mismatch between the control loop of the driver (of the lamp) and the output of the ballast. For example, the control loop's phase margin and gain margin may not be sufficient to maintain the control loop in a stable state, for the output of some ballasts; while it is enough for the output of some other ballasts. Known control loops are fixed, thus a retrofit lamp may be incompatible with at least some ballasts, even though it may be compatible with a wide range of other ballasts.

An idea of an embodiment of the invention is enabling a flexible tuning of the control loop of the lamp according to the ballast's output, to ensure the key parameters of the control loop are kept within a proper scope given the ballast's output so that the control loop thereby maintains stability.

The invention is defined by the claims.

According to aspects in accordance with an embodiment of the invention, there is proposed a control circuit for a control loop of a lighting driver adapted to controllably connect an output of an electronic ballast to an LED light source, the control circuit comprising: a differential amplifier comprising: a first input adapted to receive a sensing signal indicative of a current signal output to the LED light source; a second input adapted to receive a reference signal; and an output adapted to output a control signal, wherein the control signal is an amplification of a difference between the first and second inputs and wherein the control signal is for controlling the connection of the output of the electronic ballast to the LED light source; a biasing circuit connected to at least one input of the differential amplifier, wherein the biasing circuit has an adjustable impedance; and a tuning circuit adapted to adjust the impedance of the biasing circuit so as to tune as least one of a gain crossover frequency, a gain margin, a phase crossover frequency and a phase margin of the control loop of the lighting driver.

A lighting driver connects an electronic ballast to an LED light source. The lighting driver and LED light source are typically formed in a same lighting arrangement. In particular, the lighting driver converts a power supply that is output by the electronic ballast to a suitable power supply to drive the LED light source. The lighting driver is adapted to controllably connect or switch (e.g. using a switch based conversion) the electronic ballast to the LED light source to control a power supplied to the light source. The lighting driver may further apply appropriate filtering, rectifying and the like to the output of the electronic ballast.

The switching of the lighting driver may be controlled by a control loop. Thus, a frequency, pulse duration, pulse width and so on of the connecting of the electronic ballast to the LED light source is defined by the control loop.

The proposed invention relates to a control circuit for a control loop of such a lighting driver. The control circuit is adapted to output a control signal which defines or controls the operation of the lighting driver, and in particular, an operation of the switching or controllable connection between the output of the electronic ballast and the LED light source (e.g. via a switched-mode power supply). Thus, a (average) magnitude of a power supply provided to an LED light source from the electronic ballast is dependent upon a control signal generated by the control circuit.

The control signal provided by the control circuit is adjustable based upon an amplified difference between a sensing signal indicative of a current of the output of the electronic ballast and a reference signal (such as a dimming signal). The reference signal may define a desired dimming level of the LED light source (e.g. the lower the desired dimming level, the less time (e.g. average duty cycle) the lighting driver connects the electronic ballast to the LED light source).

The control circuit is formed by a differential amplifier which has inputs, output(s), and often a feedback path from the output(s) to the inputs. There are impedances at the inputs and optionally at the feedback path which tune the differential amplifier's response to one or more external signals.

The present invention proposes to provide an adjustable biasing circuit, which adjusts, modifies or otherwise alters one or more of the impedances of the differential amplifier. Thus, the biasing circuit adjusts or modifies a frequency response or gain of the control circuit (i.e. with respect to the output of the electronic ballast). The impedance of the biasing circuit is adjusted by a tuning circuit.

In particular, the impedance of the biasing circuit may be adjusted to thereby adjust a gain or frequency response of the control circuit. As the control signal controls an operation of the lighting driver, adjusting the impedance of the biasing circuit thereby influences, adjusts or modifies the frequency response of (the control loop of) the lighting driver, and thereby the frequency response of the overall lighting arrangement.

The described invention therefore proposes to provide a frequency response or gain modifier in a control circuit for a control loop of a lighting driver. The frequency response or gain modifier comprises a biasing circuit of an adjustable impedance, which impedance is adjusted, modified or controlled by a biasing circuit.

Embodiments of the invention thereby allow for various parameters of the lighting driver, in particular parameters of a frequency response of the lighting driver, to be tuned by controlling a biasing circuit which adjusts a control signal for the lighting driver. The control signal controls or defines how an output of an electronic ballast connects to an LED light source and thereby defines a gain, phase and/or frequency response of the lighting driver.

By adjusting an impedance of the biasing circuit, a frequency response of the lighting driver, and thus an overall lighting arrangement, may be precisely and accurately controlled. This allows for improved compatibility of the lighting driver with ballasts having different output characteristics (e.g. different output currents or frequencies).

In particular, by adjusting a gain crossover frequency, a gain margin, a phase crossover frequency or a phase margin of the driving circuit to match or otherwise correspond to an output of the electronic ballast, flicker in an LED light source may be significantly reduced across a wider range of ballasts.

Preferably, the reference signal is a dimming signal indicative of a desired dimming level of the LED light source.

The biasing circuit may comprise a feedback circuit connected between the output and at least one input of the differential amplifier.

In this way, the biasing circuit may cause the differential amplifier to act as an error amplifier circuit. By optimizing the error amplifier circuit, through controlling an impedance of the feedback circuit, the lighting driver may be made more stable with a larger number of electronic ballasts.

A suitably controlled feedback circuit helps reduce system oscillation and improve output stability of the lighting driver (i.e. the stability of the signal provided to the LED string). This results in reduced lighting flicker. In particular, the feedback circuit may stabilize the output across a wider variety of different potential ballast outputs.

The feedback circuit may comprise an adjustable capacitance circuit, wherein the tuning circuit is adapted to adjust a capacitance of the adjustable capacitance circuit to thereby change a location of a first pole of the gain response of the control circuit to thereby change the phase margin of the overall control loop. This allows for additional control over the frequency response of the overall driver.

The feedback circuit may further comprise, in parallel with the adjustable capacitance circuit, a fixed capacitance circuit and an adjustable resistance circuit connected in series, wherein the tuning circuit is adapted to adjust a resistance of the adjustable resistance circuit to thereby change the location of a first zero point and a second pole of the gain curve of the differential amplifier to thereby change the phase margin and the gain margin of the control loop (and thereby of the overall lighting driver).

The biasing circuit may comprise a second adjustable resistance arrangement connected to at least one input of the differential amplifier and unconnected from the output of the differential amplifier, wherein the tuning circuit is adapted to adjust a resistance of the adjustable resistance arrangement to thereby adjust the gain of the differential amplifier to thereby change the gain margin of the control loop. The second adjustable resistance arrangement may thereby act as a voltage biasing circuit for an input of the differential amplifier.

The tuning circuit is adapted to adjust the impedance of the biasing circuit such that at least one of: the gain margin of the lighting driver used with the electronic ballast is no less than 10 dB; the phase margin of the lighting driver used with the electronic ballast is no less than 45°, preferably no less than 60°; the phase crossover frequency of the lighting driver used with the electronic ballast is no less than half a switching frequency of the lighting driver. Preferably, the bandwidth of the frequency response lies in a range between one fifth and one tenth of the switching frequency of the lighting driver.

The control circuit may further comprise a detection circuit adapted to detect at least one of a current, frequency and voltage of a signal at the output of the electronic ballast (although it is noted that typically the detection circuit should detect both current and frequency at a same time), wherein the tuning circuit is adapted to adjust the impedance of the biasing circuit based on the at least one detected current, frequency and voltage.

Thus, proposed embodiments may enable control over the impedance of the biasing circuit to be based on parameters of the ballast. This may allow for prediction of when characteristics of the signal provided to the LED string may need to be altered (e.g. to avoid potential flicker).

The control circuit may be adapted such that the tuning circuit is adapted to identify the electronic ballast using the at least one detected current, frequency and voltage; the control circuit further comprises a storage device that stores a mapping between values of the impedance of the biasing circuit and identities of the electronic ballast; and the biasing circuit is adapted to adjust the impedance of the biasing circuit based on the identity of the electronic ballast as stored in the storage device.

By identifying a ballast, a prediction as to how the impedance of the biasing circuit (and thereby the characteristics of the signal provided to the LED string) is to be controlled may be readily optimized. For example, a database may store an indication of when an expected flicker for a particular ballast is expected to occur, and the tuning circuit may be controlled so as to avoid the flicker point for that ballast.

The differential amplifier and the tuning circuit may be arranged to form one of a type-II compensation arrangement or a type-III compensation arrangement.

Preferably, the differential amplifier and the tuning circuit are arranged to form a type-III compensation arrangement and the tuning circuit further comprises: an input impedance circuit connected to at least one input of the differential amplifier, wherein the input impedance circuit is adapted to have an adjustable capacitance, wherein said input impedance circuit is adapted to be tunable by the tuning circuit to adjust a zero and a pole of the gain curve of the differential amplifier so as to adjust the phase margin of the control circuit.

According to a concept of the invention, there is proposed a lighting driver for driving an LED light source from an output of an electronic ballast, the lighting driver comprising: a control loop comprising a sensing circuit adapted to generate a sensing signal indicative of a current signal output to the LED light source from the electronic ballast; a control circuit as previously described and coupled to the sensing circuit; a PWM circuit coupled to the control circuit and adapted to generate a PWM signal based on the output of the control circuit; and a switching circuit adapted to controllably connect the output of the electronic ballast to the LED light source in accordance with the PWM signal.

The frequency response of the overall control loop of the lighting driver may be formed from a combination of a frequency response of the control loop, excluding the control circuit, used with the electronic ballast and a frequency response of the control circuit.

The control circuit may be adapted to avoid operating in accordance with a predetermined point or level of the sensing signal.

According to an aspect of the invention, there is proposed a control method for a lighting driver adapted to controllably connect an output of an electronic ballast to an LED light source, the control method comprising: receiving, at a first input of a differential amplifier, a sensing signal indicative of a current of a signal at the output of the electronic ballast; and receiving, at a second input of the differential amplifier, a reference signal; and outputting, from an output of the differential amplifier, a control signal, wherein the control signal is an amplification of a voltage difference between the first and second input; controlling the connection of the output of the electronic ballast to the LED light source using the control signal; adjusting an impedance of a biasing circuit, having an adjustable impedance and connected to at least one input of the differential amplifier, so as to adjust the control signal and thereby tune as least one of a gain crossover frequency, a gain margin, a phase crossover frequency and a phase margin of the lighting driver.

There may be provided a computer program product comprising a computer readable storage medium having computer readable program instructions embodied therewith to, when executed on a processor arrangement, cause said processor arrangement to implement the method previously described.

The basic idea of another aspect of the invention is separating, removing or splitting a function of detecting characteristics of the ballast from the LED lamps to be used with the ballast. A dedicated detection arrangement, optionally comprising LEDs, is used for detecting the electronic ballast to be used and to provide output data relevant for defining compatibility between a 'real' LED lighting arrangement and the electronic ballast. A real LED lighting arrangement one comprising an LED light source. The LED lighting arrangement does not therefore require the functionality or components for detecting characteristics of the ballast for determining a compatibility purpose. Rather, the LED lighting arrangement may use the output data of the detection arrangement to suitably adjust the impedance of its components for compatibility with the electronic ballast. This reduces the cost and complexity of an LED lighting arrangement, as the LED lighting arrangement need not comprise a dedicated detection arrangement.

The detection arrangement and the LED lamp or lighting arrangement may therefore be separate devices which are able to communicate with one another, optionally via an intermediary device, to exchange information regarding compatibility of the LED lamp with the electronic ballast.

According to the proposed aspect, there is provided a detection arrangement for determining characteristics of an electronic ballast, wherein the detection arrangement comprises: a detection circuit adapted to determine values of output parameters of the ballast; and a first interface adapted to transmit an output signal based on the determined values of output parameters of the ballast, to an external device, wherein the output signal is suitable for being processed so as to adjust a compatibility of an LED lighting arrangement and the electronic ballast.

This embodiment provides a dedicated detection arrangement for collecting the necessary data for adjusting or improving the compatibility of a lighting arrangement and the electronic ballast. The detection arrangement may be used to test an overall lighting fixture, including the electronic ballast, and obtain an output signal for improving a compatibility of an LED lighting arrangement to be connected thereto. The output signal can be used by the external device when setting, biasing or otherwise adjusting the LED lighting arrangement for the purposes of compatibility with the electronic ballast.

In a preferred embodiment, the detection arrangement further comprises standard lamp sockets to connect to the electronic ballast. This embodiment thereby provides a kind of tool or dummy lamp for detection purposes which is easy to mount and/or connect to the existing ballast.

In a preferred embodiment, the external device comprises the LED lighting arrangement or an intermediary device to be used with both the detection arrangement and the LED lighting arrangement. This embodiment provides a direct or indirect communication path between the detection arrangement and the LED lighting arrangement.

In a preferred embodiment, the detection arrangement further comprises an LED lighting arrangement, or an LED emulation unit adapted to emulate an LED lighting arrangement. The detection circuit may be adapted to determine values of output parameters of the ballast to be used with the LED lighting arrangement (of the detection arrangement) or the emulated LED lighting arrangement.

In this embodiment, the detection arrangement can detect or predict the behavior of the electronic ballast under a real or emulated LED load. Thus, the values of output parameters of the ballast are more accurately detected in the context of a realistic LED load (i.e. in the environment in which the electronic ballast will usually operate).

Preferably, parameters or values of components of the LED lighting arrangement or LED emulation unit are adjustable, so that the detection unit may represent a plurality of different lighting arrangements or different configurations of a lighting arrangement. This improves a flexibility of the detection arrangement, allowing different lighting arrangements or configurations to be tested.

In one embodiment, the output signal comprises or provides the detected output parameters, including one or more of: an impedance, an output frequency, an output current, or an output voltage of the electronic ballast. Thus, the output signal may comprise or provide 'raw data' of the electronic ballast.

This embodiment provides a simple function at the detection arrangement that is adapted to detect and provide raw data of the electronic ballast. Determination of how to appropriately tune the LED lighting arrangement may be implemented at the external device.

Alternatively, the detection arrangement may be adapted to obtain identifying information of the electronic ballast, said identifying information identifying a model, type or an identity of the electronic ballast. This identifying information may be provided as, or contained within, the output signal. Thus, the detection arrangement may further comprise a controller to determine, based on the output parameters of the electronic ballast, the model or the identity of the electronic ballast, for example, using pre-stored data or by communicating with an external server.

In this embodiment, the detection arrangement processes the raw data of ballast output and provides a refined output signal that identifies the ballast. The refined output signal may be provided as, or contained within, the output signal of the detection arrangement, which can then be used by the external device to determine or search how to tune the LED lighting arrangement.

In some embodiments, the output signal provides suitable values for components of an adjustable impedance circuit of a lighting driver. Thus, the detection arrangement may further comprise a controller to determine, based on the output parameters of the electronic ballast, suitable values for components of the LED lighting arrangement using, for example, pre-stored data or by communicating with an external server.

In this embodiment, the detection arrangement processes the raw data of ballast output and provides the final decision on how to tune the LED lighting arrangement. Processing raw data of the electronic ballast (i.e. the identified characteristics of the ballast) may comprise looking for corresponding information in pre-stored data or by communicating with a remote server.

In one embodiment, wherein the output signal provides suitable values for components of an adjustable impedance circuit of a lighting driver, the detection arrangement is further adapted to iteratively: change values for components of the LED lighting arrangement or LED emulation unit, determine the current provided to the LED light source of the LED arrangement or emulated LED lighting arrangement; and check a level of flicker or disturbance in the current provided to the LED light source or emulated LED light source. The detection arrangement is further adapted to select the values with least flicker/disturbance as the suitable values.

In this embodiment, the processing of the raw data includes tuning the values in the detection arrangement to find the most suitable value for the LED lighting arrangement, and is more adaptive and accurate.

In another embodiment, where the output signal provides suitable values for components of an adjustable impedance circuit of a lighting driver, the detection arrangement may accordingly be adapted to: adjust values of the LED light source, or the LED emulation unit, of the detection arrangement, detect the output current from the electronic ballast, check whether there is flicker/disturbance in the output current, and taking the value with least flicker/disturbance as the suitable values.

A detection arrangement according to claim 16, wherein the output signal comprises suitable values for components of an adjustable impedance circuit of a lighting driver, wherein the detection arrangement is adapted to: change values for components in the detection arrangement, detect the output current from the electronic ballast, check whether there is flicker/disturbance in the LED current, and taking the value with least flicker/disturbance as the suitable values.

The invention also provides an intermediary device for use with a detection arrangement for determining characteristics of an electronic ballast and a LED lighting arrangement, the intermediary device comprising: an interface adapted to receive an output signal from the detection arrangement, wherein the output signal is representative of the electronic ballast; and a controller adapted to process the output signal; wherein the interface is further adapted to transmit the processed output signal to a lighting arrangement, wherein the processed output signal is suitable for being processed so as to adjust a compatibility of an LED lighting arrangement and the electronic ballast.

In this embodiment, an intermediary device is provided with processing power to process the output signal from the detection arrangement and to obtain more refined instructions for the LED lighting arrangement. This intermediary device could be implemented in a smart or portable device having a large storage capacity and network access. Thus, proposed functions can be implemented in a low cost manner by re-using or appropriating already existing smart or portable device.

In one embodiment, the output signal received by the intermediary device comprises or provides output parameters of the electronic ballast, including one or more of an impedance, an output frequency, an output current, and/or an output voltage of the electronic ballast. The controller of the intermediary device is adapted to determine the model, type or identity of the ballast or to determine suitable values for components of an adjustable impedance circuit of the lighting arrangement, based on the output parameters of the electronic ballast.

In this embodiment, the intermediary device processes the raw data of the electronic ballast and obtains refined identifying information or the final decision for tuning the LED lighting arrangement. This mitigates the complexity of processing or circuitry at the detection arrangement and/or at the LED lighting arrangement.

In one embodiment, the output signal received by the intermediary device comprises or provides (information indicating) the model, type or identity of the ballast. The controller may be adapted to determine suitable values for components of an adjustable impedance circuit of the lighting arrangement based on the model, type or identity of the ballast.

In this embodiment, the intermediary device processes the refined identifying information and obtains the final decision for tuning the LED lighting arrangement. This mitigates the complexity at the LED lighting arrangement.

The controller of the intermediary device may be adapted to process the output signal with reference to pre-stored data or data stored on an external server, rather than this being performed by the detection arrangement or the LED lighting arrangement. This improves an efficiency of the system, as the intermediary device usually has greater freedom with respect to storing or computing data or an improved speed/ability to communicate or network with external server.

In one embodiment, the output signal comprises or provides suitable values for components of an adjustable impedance circuit of the lighting arrangement, and the controller is adapted to relay the suitable values via the interface to the LED lighting arrangement. This mitigates the complexity at the LED lighting arrangement.

An aspect of the invention also provides an LED lighting arrangement for use with an electronic ballast, said lighting arrangement comprising an adjustable impedance arrangement adapted to connect the electronic ballast to an LED light source, wherein said lighting arrangement is further adapted to: communicate with an external detection arrangement or an external intermediary device for the detection arrangement, receive an output signal suitable for being processed so as to adjust the compatibility of the lighting arrangement and the electronic ballast; and adjust the adjustable impedance arrangement according to the output signal.

This enables an LED lighting arrangement to obtain the data about the ballast from an external device, rather than performing its own detection, for the purposes of compatibility tuning. This reduces the complexity of the LED lighting arrangement.

In an embodiment, said adjustable impedance arrangement comprises any one or both of: an input impedance observed or seen by the electronic ballast, preferably comprising a series capacitance connecting the ballast to a power converter of the LED lighting arrangement; and an adjustable impedance in a control loop of a power converter of the LED lighting arrangement.

This embodiment lists two possible examples of the adjustable impedance arrangement, whose impedance may be adjusted so as to alter, improve or modify a compatibility of the LED lighting arrangement with a variety of LED lighting arrangements. Allowing for an adjustable impedance increases a compatibility of the LED lighting arrangement with a wider variety of electronic ballasts. It should be noted that the lighting arrangement may comprise other tunable or adjustable impedance arrangements provided the adjustable impedance arrangement is able to improve, adjust or modify a compatibility or workability of the LED lighting arrangement with the electronic ballast.

In one embodiment the output signal received by the LED lighting arrangement comprises or provides suitable values for components of the adjustable impedance circuit of the lighting arrangement.

The LED lighting arrangement may thereby directly tune the adjustable impedance circuit according to the values indicated in the output signal and is low cost for the LED lighting arrangement.

In another embodiment, the output signal comprises information indicating output parameters of the electronic ballast, including one or more of: an impedance, an output frequency, an output current, or an output voltage of the electronic ballast; or identifying information of the electronic ballast, said identifying information identifying a model, type or an identity of the electronic ballast; and the LED lighting arrangement comprises a controller adapted to determine suitable values for components of the adjustable impedance circuit according to the output signal, based on pre-stored data or an external server.

This embodiment enables the LED lighting arrangement to process the raw data or refined identifying information of the ballast, and reduces the complexity of the external device.

In one embodiment, the LED lighting arrangement excludes a detection component for detecting the output parameters of the electronic ballast for the purposes of adjusting compatibility. This embodiment reduces the cost of the LED lighting arrangement. In the above described embodiments, the output signal comprises or provides information which may be suitably processed to determine, set, tune or define appropriate values for an adjustable impedance of the lighting arrangement. Embodiments thereby enable an adjustable impedance to be tuned based on detected parameters of the electronic ballast, so as to improve a compatibility of the lighting arrangement.

These and other aspects of the invention will be apparent from and elucidated with reference to the embodiment(s) described hereinafter.

BRIEF DESCRIPTION OF THE DRAWINGS

Examples of the invention will now be described in detail with reference to the accompanying drawings, in which.

DETAILED DESCRIPTION OF THE EMBODIMENTS

According to a concept of the invention, there is proposed a control circuit for a control loop of a lighting driver. The lighting driver is adapted to controllably connect an electronic ballast to an LED light source or lamp. The control loop controls the connection performed by the lighting driver based on a control signal provided by the control circuit. The control circuit comprises a differential amplifier and a biasing circuit having an adjustable impedance connected to the differential amplifier. A tuning circuit adjusts the impedance of the biasing circuit so as to tune the impedance of the differential amplifier, to thereby tune a parameter of a frequency response of the overall control loop of the lighting driver. This allows the overall driver to be made more stable for a specific ballast.

Embodiments are at least partly based on the realization that a frequency response of the lighting driver can be modified by controlling an impedance of a biasing circuit (of a control circuit). This allows for greater compatibility of a lighting driver, and therefore a lighting arrangement associated therewith, with a wider variety of ballasts. In particular a frequency response of the lighting driver can be tuned to meet the requirements of a currently used electronic ballast.

Illustrative embodiments may, for example, be employed in retrofit lighting arrangements adapted to replace existing fluorescent or halogen lamps which are driven by an electronic ballast.

It is well known by the skilled person that a generic electronic system is associated with a frequency response, indicating how an output of the system responds to varying frequencies of an input. The frequency response may be divided into a gain response or gain curve (indicating a gain of the system with respect to different frequencies) and a phase response or phase curve (indicating a change in phase between an input and an output for different frequencies). The frequency response is often plotted or represented using a Bode diagram, which typically plots both the gain response and the phase response.

Figure 1:
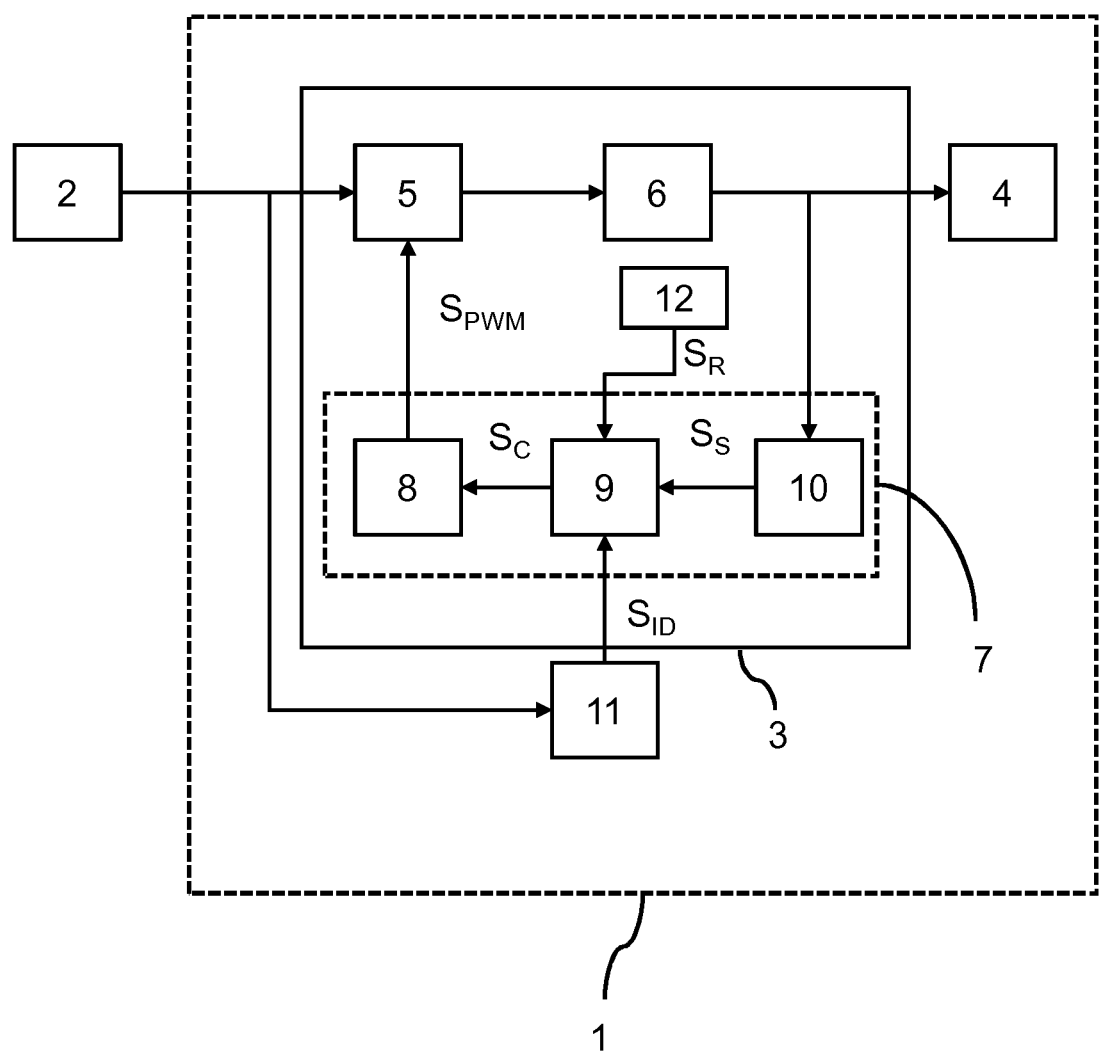
FIG. 1 illustrates a control circuit formed as an aspect of a lighting arrangement according to an embodiment.

FIG. 1 is a block diagram of an overall lighting arrangement 1 adapted to replace an existing fluorescent or halogen lamp driven by an electronic ballast 2.

The lighting arrangement 1 comprises a lighting driver 3, which operatively couples the electronic ballast 2 to a LED light source 4 or LED lamp.

The lighting driver 3 comprises a switch-based converter 5 or switching circuit which controllably connects the output of the electronic ballast 2 to the LED light source 4. Preferably the lighting driver 3 further comprises a capacitor arrangement 6 which filters and/or smooths the output of the converter 5 before providing it to the LED light source 4.

In one example, the switch-based converter 5 is a shunt switch that determines whether to shunt the ballast output or not so as to determine how much power from the ballast goes to the LED light source 4. One such converter is disclosed in US 2013/0320869 A1. Other kinds of switch-based converters may also be adapted for use in a lighting driver, such as a typical switched mode power supply having a power commutation component (e.g. comprising an inductor and a switch) to control the power commutation.

The lighting driver 3 further comprises a control loop 7. The control loop is adapted to output a signal $S_{PWM}$ for controlling an operation of the converter 5. In this way the control loop 7 controls an amount of current provided to the LED light source 4.

In particular, the control loop 7 comprises a pulse width modulation, PWM, circuit 8 adapted to generate a PWM signal $S_{PWM}$ which controls the operation of the converter 5. Control methods for a converter using PWM signals will be well known to the skilled person.

The control loop 7 also comprises a control circuit 9 which outputs a control signal $S_C$ for controlling the operation of the converter 5. Here, the control signal $S_C$ is passed to the pulse width modulation circuit 8, which generates the PWM signal $S_{PWM}$ based on the control signal $S_C$. By way of example, a voltage level of the control signal $S_C$ may indicate a desired pulse width or pattern of a PWM signal. Other methods of defining the PWM signal will be known to the skilled person.

The control loop 7 further comprises a sensing circuit 10 adapted to sense a current signal provided to the LED light source (i.e. from the electronic ballast 2 via the lighting driver 3). The sensing circuit outputs a sensing signal $S_S$ indicative of this current signal. By way of example a voltage level of the sensing signal may indicate a magnitude of a current or an RMS of a current provided to the LED light source 4 from the electronic ballast 2. According to the sensing signal, the control loop decides to provide more or provide less power to the LED light source 4, and accordingly outputs the control signal $S_C$.

The lighting arrangement 1 may further comprise a detection circuit 11 adapted to detect at least one of the current, frequency and/or voltage of a signal provided at an output of the electronic ballast (i.e. the signal provided to the lighting driver). An identifying signal $S_{ID}$ may be output by the detection circuit to the control circuit 9, comprising information about the detected current, frequency and/or voltage output by the electronic ballast. The identifying signal may be substantially unique to a particular ballast or ballast type. In some embodiments, the detection circuit is formed as part of the lighting driver 3. Embodiments of suitable detection circuits and detection arrangements comprising said detection circuits are described later.

The control circuit 9 is adapted to receive the sensing signal $S_S$ generated by the sensing circuit 10 and a reference signal $S_R$. The control signal $S_C$ may be generated based on at least the sensing signal $S_S$ and the reference signal $S_R$, as will be explained in detail below. A value of the reference signal $S_R$, such as a voltage level, preferably indicates a desired dimming level of the LED light source 4. The reference signal $S_R$ may be generated in the driver 3 by a microcontroller or MCU 12, such as in response to a user input or received communication. Alternatively, the reference signal may be provided to the driver 3 directly from an external source, such as a user interface.

The control loop 7 provides feedback control for the lighting driver 3. This involves measuring the system variable (sensed current $S_S$), obtaining an error signal (e.g. control signal $S_C$ or PWM signal $S_{PWM}$) by comparing the system variable $S_S$ to a desired value (reference signal $S_R$) and influencing the generation of the system variable based on the error signal. The converter 5 generally require feedback control for maintaining an output signal at a desired level. Improper feedback control leads to system oscillation and possibly unstable output. For a lighting driver, improper feedback control can result in LED flicker. It is therefore important to provide a stable control loop 7 which responds appropriately to the sensed current $S_S$.

The frequency response of the control loop 7 is the combination of the frequency response of the control circuit 9 and the frequency response of the other elements of the control loop 7 (i.e. the sensing circuit 10 and the pulse width modulation circuit 8). It is desirable to ensure that appropriate components and component values of the control loop 7 are selected such that the control loop 7 is stable with respect to a frequency of the ballast 2 and optionally the output to the LED light source 4.

The frequency response of the overall lighting driver 3, wherein the input of the driver is the electronic ballast 2 output and the output of the driver is the signal provided to the LED light source 4, is dependent upon the characteristics of the control loop 7 as well as the characteristics of the converter 5 and the capacitor arrangement 6. Adjusting the frequency response of the control loop 7 adjusts the frequency response of the overall lighting driver 3. In this way, adjusting the frequency response of the control circuit 9 adjusts the frequency response of the lighting driver 3.

In a typical LED lighting arrangement, flicker can occur because of a mismatch between the output frequency of the ballast 2 and the switching frequency, pulse width or other properties of the switching performed by the converter 5. Adjusting a frequency response of the lighting driver to take account of characteristics of the electronic ballast may avoid such a mismatch, and thereby avoid LED flicker.

Figure 2:
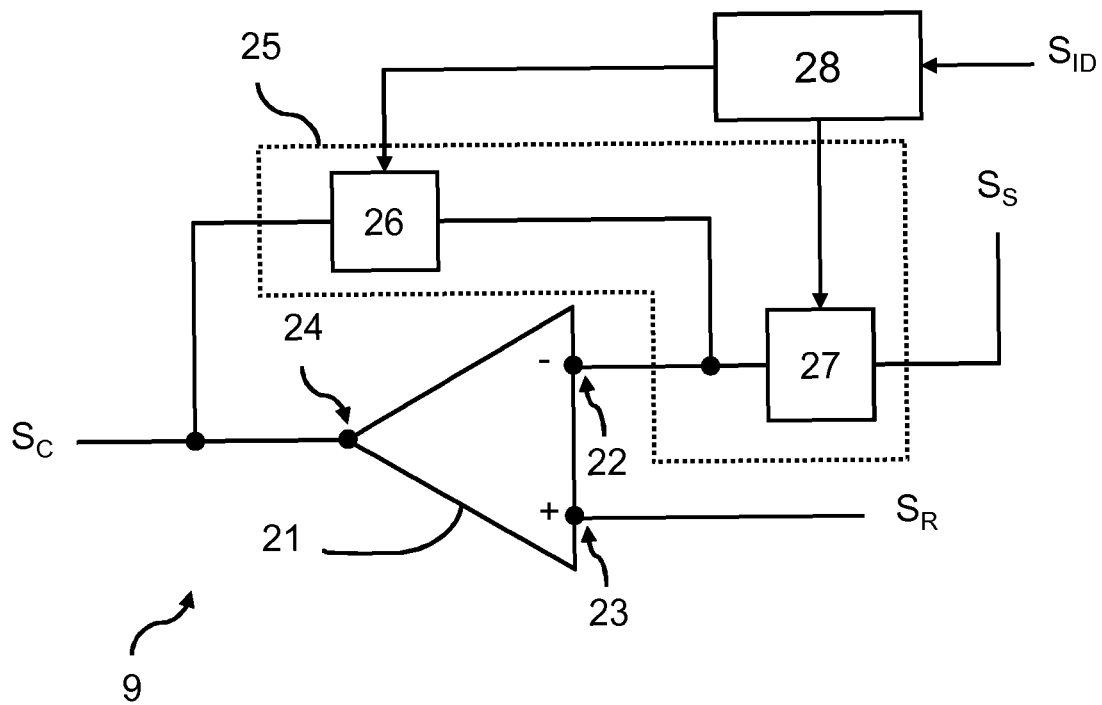
FIG. 2 is a block diagram of a control circuit according to a general embodiment.

FIG. 2 is a block diagram which illustrates a control circuit 9 according to a general embodiment of the invention. Power rails have been omitted for the sake of clarity.

The control circuit 9 comprises a differential amplifier 21 having a first input 22, a second input 23 and a single output 24. The first input 22 receives the sensing signal $S_S$ and the second input 23 receives the reference signal $S_R$. The differential amplifier 21 amplifies the difference between the reference signal $S_R$ and the sensing signal $S_S$ to generate the control signal $S_C$ at the output 24.

Throughout the described embodiments, the reference signal $S_R$ represents a desired dimming level of the LED light source 4. In particular, a voltage level of the reference signal $S_R$ indicates a desired dimming level. By way of example, the voltage level of the reference signal $S_R$ may indicate a desired output current level of the lighting driver. In this way, the control circuit 9 may be an error amplifier, and the control signal may indicate an error between a present output signal $S_S$ to the LED light source and a desired output signal $S_R$ to the LED light source.

The control circuit 9 comprises a biasing circuit 25 connected to at least one input 22, 23 of the different amplifier. The biasing circuit is adapted to bias at least one of the signals received at the first or second input 22, 23.

The biasing circuit 25 may comprise a feedback circuit 26 connected between the output 24 and the first input 22. In some embodiments, the biasing circuit 25 comprises an impedance arrangement 27 connected to the first input 22 (i.e. to bias the sensing signal $S_S$). Other biasing arrangements for the biasing circuit 25 will be appreciated, for example, a feedback circuit connected between the output 24 and the second input 23 or an impedance arrangement connected to the second input.

In known embodiments, parameters for components of a biasing circuit are designed to suitable sufficient gain and phase margins for the desired input/output conditions. However, as there are a wide variety of different electronic ballasts, a single set of parameters is generally not sufficient to fulfil all situations (e.g. variable dimming levels) for each type of ballast. The proposed embodiments overcome this issue by providing a method for varying parameters of components for the biasing circuit.

The biasing circuit 25 is adapted to have an adjustable impedance. By way of example, at least one of the feedback circuit 26 and the impedance arrangement 27 may have an adjustable capacitance, resistance and/or inductance (i.e. impedance). Electrically adjustable impedances are well known to the skilled person.

The impedance of the biasing circuit 25 is adjustable by a tuning circuit 28. The tuning circuit is thereby adapted to control or tune a frequency response of the overall control circuit 9. In particular, by adjusting an impedance of the biasing circuit 25, a position of poles and/or zeros of the frequency response of the control circuit 9 can be altered. This thereby enables the gain margin, gain crossover frequency, phase margin and/or phase crossover frequency of the control circuit 9 to be altered by the tuning circuit.

Adjusting the frequency response of the control circuit 22 enables control over the frequency response of the overall control loop 7, and thereby the lighting driver 3. This enables the control loop 7 to compensate for the overall system frequency response, and make the control loop stable with a wider variety of ballasts. In particular, parameters of the lighting driver 3 may be adapted, modified or adjusted to one set of values by the control loop 7 so as to match an output of the electronic ballast 2 (e.g. with respect to frequency); and adapted to another set of values so as to match an output of a different electronic ballast. Thus flicker of an LED light source may be significantly reduced.

The tuning circuit 28 may be adapted to modify the impedance based on the identifying information in the identifying signal $S_{ID}$. The identifying signal $S_{ID}$ is generated by a detection circuit, as will be described later.

For the avoidance of doubt, it is noted that the frequency response of the control circuit 9 indicates a response of the control $S_C$ with respect to at least the sensing signal $S_S$.

Figure 3:
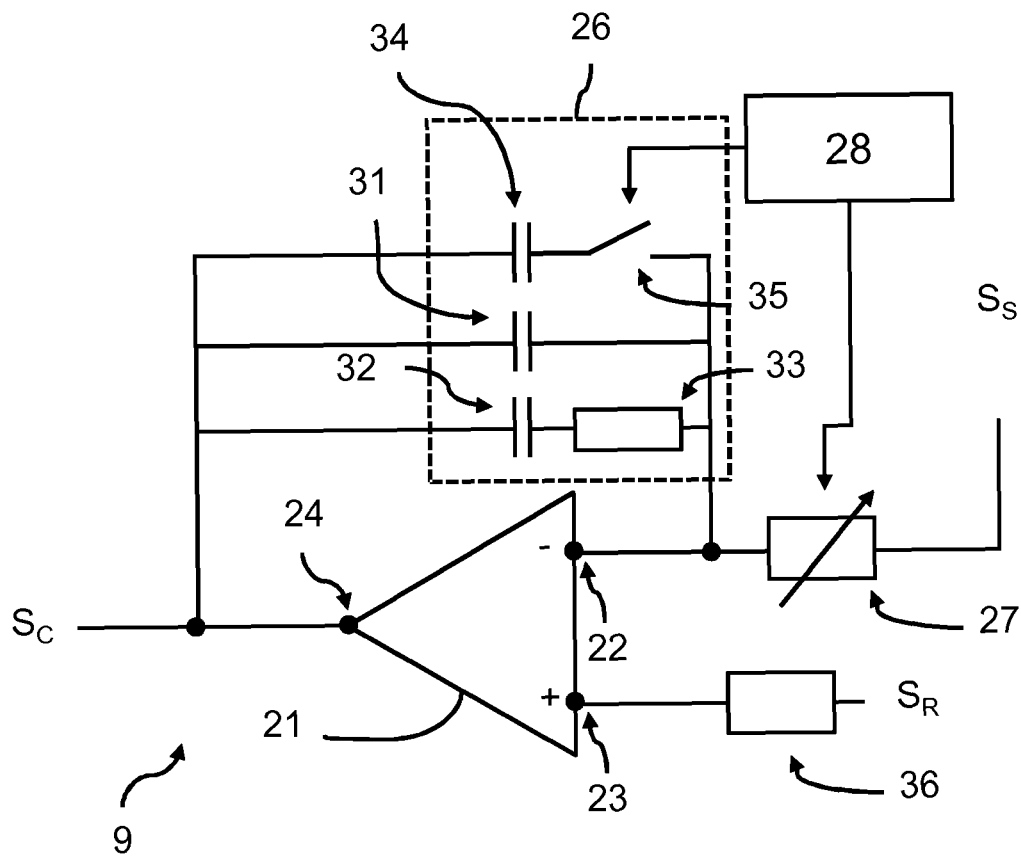
FIG. 3 is a circuit diagram of a control circuit according to a first embodiment.

FIG. 3 illustrates a control circuit 9 according to a first embodiment of the invention. The control circuit 9 comprises a modified type-II error amplifier.

The feedback circuit 26 comprises a first capacitor 31, and a capacitor-resistor arrangement 32, 33 arranged in parallel.

The capacitor-resistor arrangement comprises a second capacitor 32 and a resistor 33 arranged in series. Of course, one or both of the first capacitor 31 and the capacitor resistor arrangement 32, 33 may be omitted in some embodiments. This may reduce a number of components required for the feedback circuit.

The feedback circuit further comprises a third capacitor 34 arranged in parallel with the first capacitor 31 and the capacitor-resistor arrangement 32, 33.

The third capacitor 34 is arranged in series with a (electrical) switch 35 e.g. a MOSFET. The tuning circuit 28 is adapted to control an operation of the switch 35 so as to selectively switch the third capacitor 34 into the feedback circuit 26. In this way a capacitance of the feedback circuit 26 can be modified by the tuning circuit 28. Thus, the feedback circuit 26 comprises an adjustable capacitance circuit 31, 34, 35.

The tuning circuit 28 may be adapted to control the connection of the third capacitor 34 according to a pulse width modulation scheme, to thereby control the magnitude of the capacitance of the feedback circuit 26.

Adjusting a capacitance of the adjustable capacitance circuit 26 changes a location of a first pole of a gain response of the control circuit 9. Thus, a gain margin and a phase margin of the control circuit may be adjusted by controlling the capacitance of the adjustable capacitance circuit.

The impedance arrangement 27 comprises a variable resistor and/or a potentiometer, which may act as an adjustable resistance arrangement. The tuning circuit 28 may be adapted to adjust the resistance of this adjustable resistance arrangement 27. Changing the resistance of the adjustable resistance arrangement changes a location of a zero point of the gain response. Thus the tuning circuit may adjust a gain of the control circuit 9 and thereby tune, adjust or otherwise alter the gain margin and the phase margin of the control loop (and thereby the overall lighting driver).

Generally speaking the frequency response of the control circuit 9 is determined by the circuit parameter design (i.e. the values of the various resistors, capacitors and/or inductors). Adjusting these parameters, using an adjustable capacitance circuit and/or an adjustable resistance arrangement, thereby enables control over the frequency response of the control circuit 9.

Figure 4:
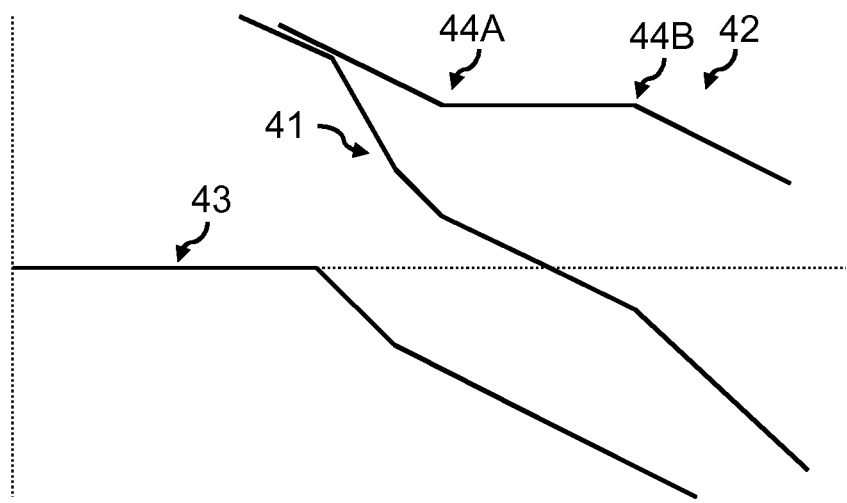
FIGS. 4 and 5 are explanative Bodes plot of a lighting driver.
Figure 5:
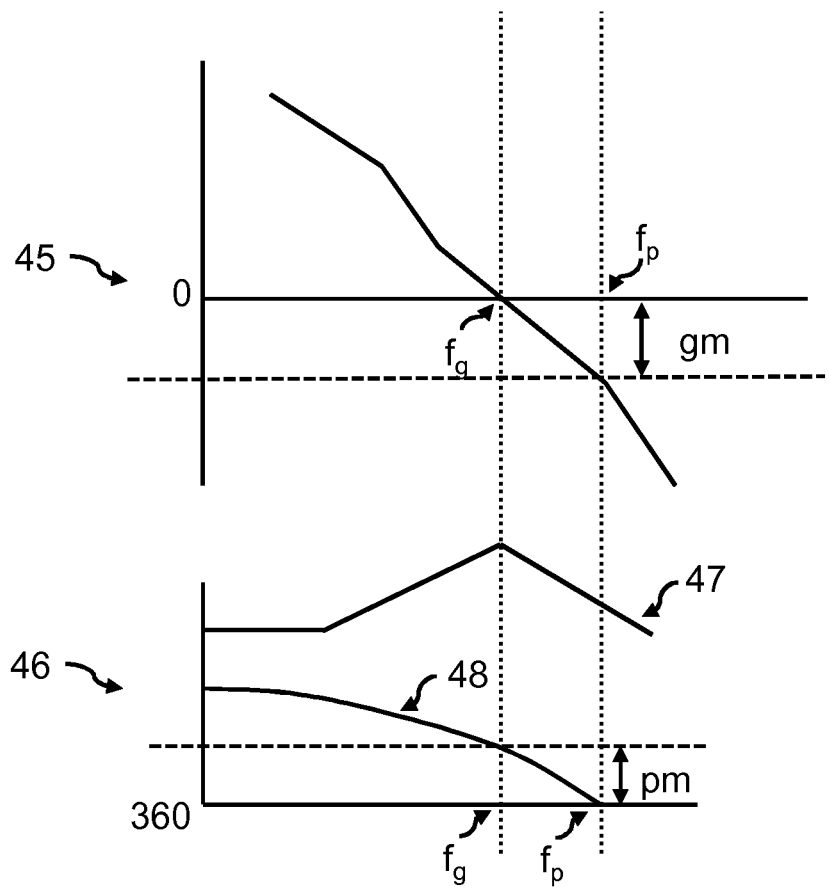

FIGS. 4 and 5 provide explanatory Bode plots or diagrams of a frequency response of the overall lighting driver 3 according to the first embodiment.

In particular, FIG. 4 illustrates a plot 41 or gain response, sometimes called a gain plot or gain curve, illustrating a gain (y-axis) of the driver 3 with respect to frequency (x-axis). The frequency is the frequency of the output of the electronic ballast 2, and the gain represents the gain of the signal provided to the LED light source 4 by the driver 3.

The gain response 41 of the driver 3 is a sum of the gain response 42 of the control circuit 9 and the gain response 43 of the other elements of the driver 3 (e.g. the converter 5, capacitor arrangement 6, PWM circuit 8 and sensing circuit 10). It will therefore be apparent that adjusting the gain response of the control circuit 9 adjusts the gain response of the overall driver 3, as previously described.

In a similar fashion, adjusting the phase response of the driver 3 may be effected by adjusting the phase response of the control circuit 9. Thus, the phase response of the driver 3 is a sum of the phase response of the control circuit 9 and the phase response of the other element of the driver 3. In this way, the overall frequency response of the driver 3 is controllable by adjusting the frequency response of the control circuit 9.

A curve 47 illustrating a phase response of a control circuit 9 and a curve 48 illustrating a phase response of the whole driver 3 is illustrated in the lower drawing 46 of the Bode plot or diagram provided FIG. 5, as will be later described.

Of course, it will similarly be appreciated that adjusting the frequency response of the control circuit 9 affects the frequency response of the control loop 7 (comprising the control circuit 9, PWM circuit 9 and sensing circuit 10). It may be helpful to consider the response of the overall control loop 7 when calculating appropriate characteristics for the components of the control circuit 9.

FIG. 5 provides an exemplary Bode plot or diagram of a frequency response of the lighting driver 3 according to an embodiment.

The Bode plot or diagram comprises a first plot 45 or gain response, sometimes called a gain plot or gain curve, illustrating a gain (y-axis) of the driver 3 with respect to frequency (x-axis). The Bode plot or diagram also comprises a second plot 48 or phase response, sometimes called a phase plot or phase curve, illustrating a phase change (y-axis) of the driver 3 with respect to frequency (x-axis). A plot 49 of the phase response of the control circuit 9 is also provided for the sake of improved understanding.

A gain crossover frequency $f_g$ is a frequency at which the gain of the driver 3 is zero (0). A phase crossover frequency $f_p$ is the frequency at which the magnitude of the phase change of the driver 3 is 360° (or 0°). A gain margin gm is a difference in gain between the phase crossover frequency and the gain crossover frequency. A phase margin pm is a difference of phase change between the phase crossover frequency and the gain crossover frequency.

The skilled person will appreciate that the phase crossover frequency location may vary depending upon whether the electronic system provides an inverted or non-inverted output.

A system is generally considered stable (for a particular input signal) if a magnitude of a phase lag at a frequency of the input signal is less than 360°. There is also generally a desire to maximize a gain of a system and/or maintain a flat gain response across a frequency area of interest. Thus, there is a clear desire to provide a driver with an appropriate frequency response to a wide variety of different electronic ballasts.

It would be well known to the skilled person that a frequency response of a system, such as the lighting driver 3, is defined by one or more poles and zeros. The location or position of these poles and zeros depends upon values of components of that system (i.e. of the lighting driver).

The present invention proposes to (dynamically) adjust the poles and zeros of the control circuit 9 to thereby affect and control the location of poles and zeros of the control loop 7 and thereby of the overall driver 3. As previously described, the frequency response of the control circuit contributes to a frequency response of the overall driver 3. This enables the control driver 3 adapt the driver to a wider variety of electronic ballasts.

The gain response 42 of the control circuit 9 is associated with a first zero 44A and a first pole 44B in accordance with known control systems. By modifying an impedance of the feedback circuit (e.g. of the adjustable capacitance circuit 26 or adjustable resistance circuit 27) a location of the first zero 44A and/or first pole 44B may be controlled.

Controlling the location of the first zero 44A and the first pole 44B adjusts a frequency response of the driver 3, and thereby alters a gain/phase crossover frequency, gain margin and/or a phase margin of the driver 3. Thus, a control over the frequency response of the driver 3 may be effected by controlling the adjustable impedance provided in the control circuit 9.

By way of example only, shifting the first pole 44B would adjust a gain crossover frequency $f_g$ of the driver 3.

Controlling the adjustable impedance thereby allows the control circuit to adapt the driver 3 for different ballasts which may output different frequencies. For example, a location of the zero and/or pole may be adjusted to stabilize the driver 3 with respect to a particular frequency. By way of example, for a ballast having a lower output frequency, a location of the first pole 44B may be shifted leftwards (i.e. to a lower frequency).

Adjusting the capacitance of the adjustable capacitance circuit 31, 34, 35 changes a location of the first pole 44B of the gain response.

Preferably, the frequency response of the driver (which is controllable by adjusting the frequency response of the control circuit 9) should be controlled so as to meet certain criteria.

In particular, it would be preferable for the phase margin of the driver to be sufficient to prevent oscillation, e g a minimum of around 45° and preferable no less than 60°. It would also be preferable for the gain margin of the driver to be no less than 10 dB. Preferably, the gain response of the driver has a slope of −20 dB/decade when passing through 0 dB (i.e. at the gain crossover frequency) and/or the bandwidth of the driver is between ⅕ to 1/10 of the switching frequency (defined by the converter 5).

Controlling characteristics of the control circuit in this way provides a more stable overall driver 3. The identified criteria provides particularly flexible and high quality driver 3.

Figure 6:
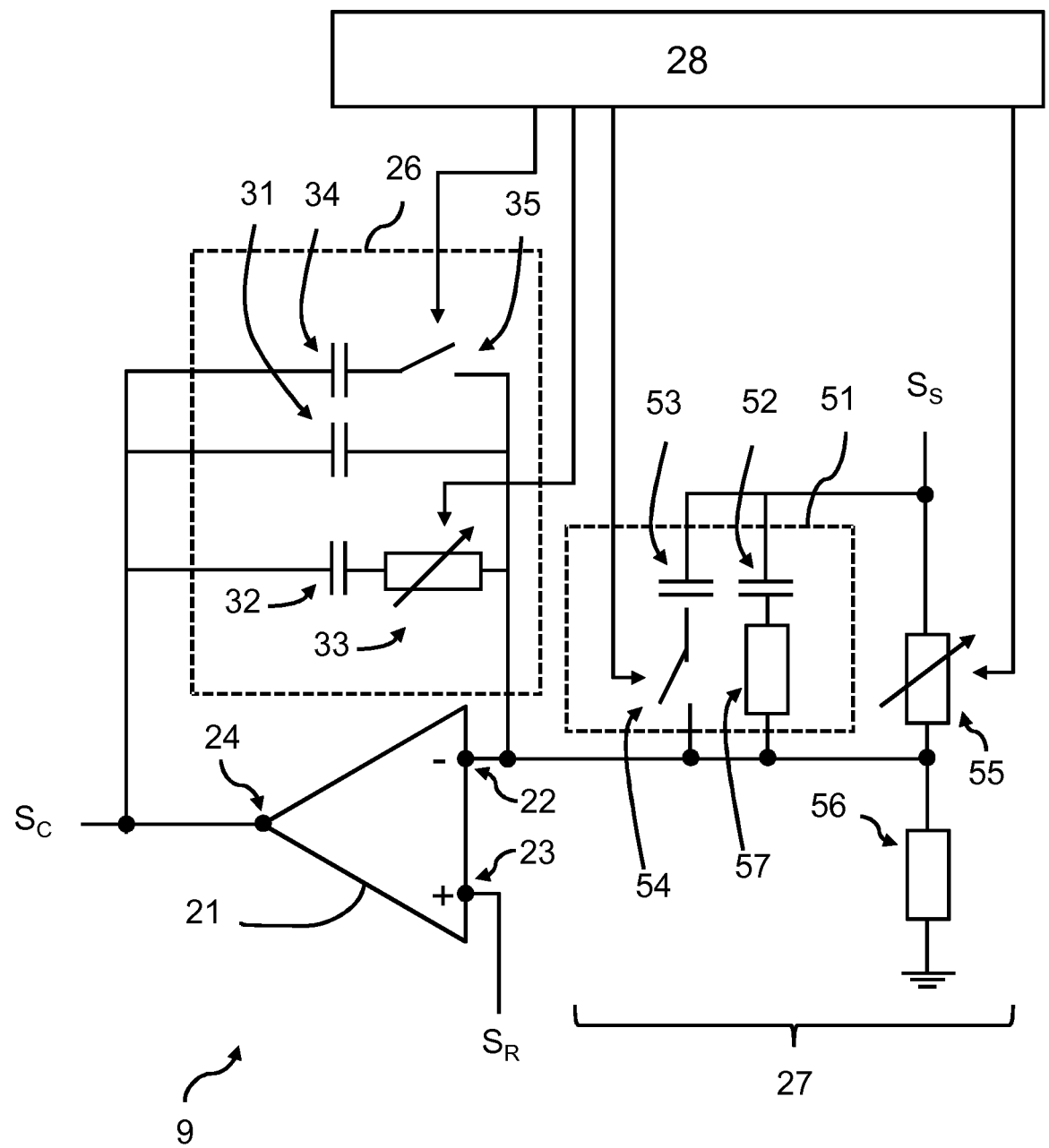
FIG. 6 is a circuit diagram of a control circuit according to a second embodiment.

FIG. 6 illustrates a control circuit 9 according to a second embodiment of the invention. The second embodiment is essentially a further modified version of the first embodiment, and illustrates a modified type-III error amplifier. The same reference numerals have been used to identify similar or identical components.

The resistor 33 of the capacitor-resistor arrangement 32, 33 has been modified to instead comprise a variable resistor or a potentiometer. Thus, the feedback circuit 26 may further comprise a variable resistance arrangement, which allows for improved control over the frequency response of the control circuit 9. The feedback circuit 26 thereby comprises a first variable capacitance circuit 31, 34, 35 and a first variable resistance circuit 32, 33.

The impedance arrangement 27 has been modified to instead comprise a second variable capacitance arrangement 51 and a second variable resistance arrangement 55, 56.

The second variable capacitance arrangement controls a capacitance between the sensing signal $S_S$ and the first input 22 of the differential amplifier 21. The operation of the second variable capacitance arrangement 51 is substantially the same as the first variable capacitance arrangement 31, 34, 35 previously described, comprising a capacitor 52 and a capacitor-switch 53, 54 arranged in parallel. The second variable capacitance arrangement may further comprise a resistor 57 in series with the capacitor 52.

The first variable resistance arrangement 55, 56 comprises a variable resistor 55 and a resistor 56 arranged as a voltage divider. Adjusting a resistance of the variable resistor 55 adjusts a biasing of the first input 22 with respect to the sensing signal. Thus, the variable resistance arrangement 55, 56 may controllably adjust a resistance between the sensing signal $S_S$ and the first input 22. The variable resistance arrangement 55, 56 may instead comprise, for example, a potentiometer to achieve the same effect.

Provision of a variable capacitance arrangement 51 and a variable resistance arrangement 55, 56 in the impedance arrangement 27 provides additional (controllable) poles and zeros in the frequency response of the control circuit 9, in accordance with known principles. Thus, by providing such additional arrangements, further and more precise control over the frequency response of the control circuit 9 can be realized. In particular, controlling the capacitance and resistance of the variable resistance arrangement 27 enables the tuning circuit to control the position of the poles and zeros of the frequency response of the control circuit 9, and thereby of the control loop and the lighting driver.

Figure 7:
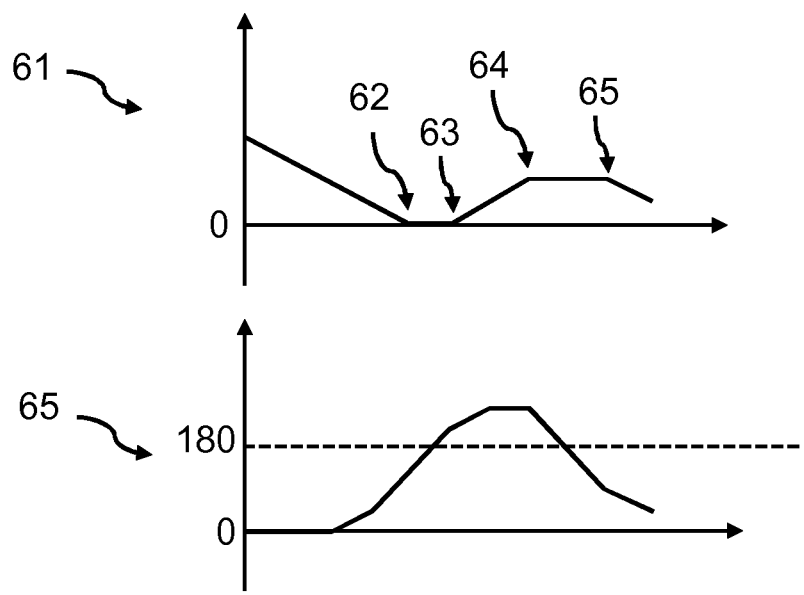
FIG. 7 is a Bode plot of the control circuit according to the second embodiment.

FIG. 7 is a representative Bode plot or diagram of a frequency response of the control circuit 9 according to the second embodiment, illustrating a gain response 61 and a phase response 65. These responses have been illustrated in the same manner as in FIG. 4.

As previously explained, adjusting the frequency response of the control circuit 9 controls, affects or otherwise adjusts a frequency response of the overall lighting driver 3.

It is clear that the gain response is associated with at least a first zero 62, a second zero 63, a first pole 64 and a second pole 65.

Adjusting a resistance of the first variable resistance arrangement 32, 33 modifies a position of the first zero 62. Adjusting a capacitance of the second variable capacitance arrangement 51 modifies a position of the first pole 64. Adjusting a resistance of the second resistance and/or a capacitance of the second capacitor arrangement adjusts a position of the second zero 63. Adjusting a resistance of the first resistance arrangement 33 or a capacitance of the first capacitance arrangement 31, 34, 35 adjusts a position of the second pole 65.

Thus a location of the poles/zeroes associated with the control circuit 9 can be readily modified by varying an impedance of components of the biasing circuit of the control circuit 9. In this way, a frequency response of the control loop 7 and the overall lighting driver 3 may be adjusted by varying the impedance of components of the biasing circuit.

In at least one embodiment, the capacitance of the second capacitor 32 may also be adjustable (e.g. replaced by a variable capacitance arrangement previously described). This enables yet further control over the position of zeros and poles of a frequency response. In particular, modifying the capacitance of the second capacitor 32 would modify a position of the first zero 62.

In at least one embodiment, the resistance of the resistor 57 may also be adjustable (e.g. replaced by a variable resistance arrangement previously described). This enables yet further control over the position of zeros and poles of a frequency response.

Thus embodiments enable adjustments to be made to the location of the poles and/or zeros of the frequency response of the control circuit 9. This enables significant control over the gain margin and/or phase margin of the control circuit 9, and thereby of the control loop 7 and the overall lighting driver 3.

Other arrangements for an adjustable resistance circuit may be readily realized by the skilled person, such as a selectively connected resistor in series with a current resistor, and so on. Other arrangements for an adjustable capacitance circuit would also be realized by the skilled person, such as a voltage or digitally tuned capacitor. Of course, some adjustable impedance circuits may comprise an adjustable inductance circuit.

Figure 8:
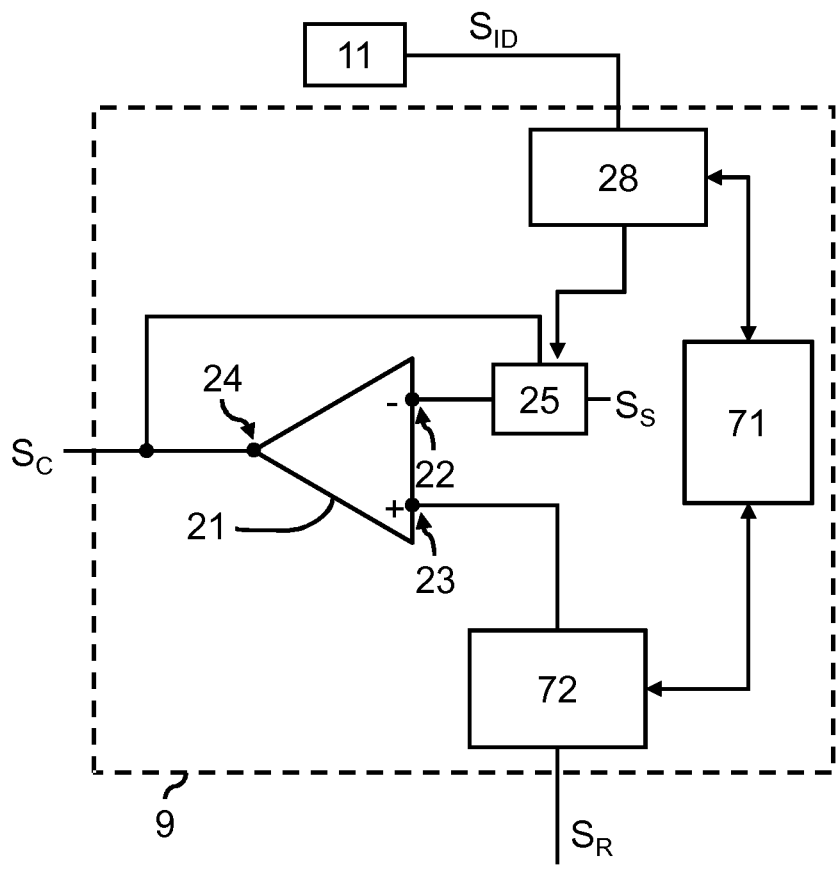
FIG. 8 is a block diagram of a control circuit according to another embodiment.

FIG. 8 illustrates a control circuit 9 according to another embodiment of the invention. The control circuit comprises a differential amplifier 21, a biasing circuit 25 and a tuning circuit 28 as previously described. The biasing circuit 25 may comprise any biasing circuit previously described.

The tuning circuit 28 may be adapted to communicate with a storage system 71 or memory in order to determine how to adjust an impedance of the biasing circuit. The storage system may be a part of the control circuit 9 or may be located externally to the control circuit (e.g. on a cloud-computing network or server).

In one embodiment, the control circuit 9 obtains an identifying signal $S_{ID}$, which $S_{ID}$ indicates at least one of a current, voltage and/or frequency of a signal output by the ballast.

The identifying signal $S_{ID}$ may be processed to identify the electronic ballast. In one embodiment, the tuning circuit 28 uses a database (e.g. stored in the storage system) to identify an electronic ballast or ballast type associated with the information contained in the identifying signal $S_{ID}$. By way of example, a particular ballast or ballast type may be identified with a particular output frequency. In one example, a known ballast type ICN-2P32-N is associated with an output frequency of around 50 kHz, whereas another known ballast type ICN-4P32-N is associated with an output frequency of around 51 kHz.

Output characteristics (frequency, voltage, current) of the electronic ballast may vary depending upon a desired operation of a LED light source (e.g. a dimming level or an on/off state of the lighting arrangement). In some embodiments, the tuning circuit may therefore use the reference signal or determine an on/off state of the lighting arrangement in order to identify the electronic ballast or ballast type.

Output characteristics (frequency, voltage, current) of the electronic ballast may also depend upon an impedance at the output of the ballast (e.g. an impedance of the overall lighting arrangement as seen by the ballast). In some embodiments, the tuning circuit may therefore determine and use an impedance at the output of the ballast when identifying the electronic ballast.

It has been advantageously recognized that a determined current and frequency of a signal output by the ballast is sufficient to accurately identify a ballast or ballast type. Thus, using such parameters significantly increases an accuracy of identifying the correct ballast and thereby enables accurate operation of the tuning circuit.

The tuning circuit may then determine desired impedance values for the biasing circuit 25 based on the identity of the electronic ballast. In particular, the storage device may map an identity of an electronic ballast to desired impedance values (e.g. in a database or table). The tuning circuit may extract the desired impedance values from the storage device. The stored desired impedance values may correspond to known or preferred impedance values which enable the impedance or frequency response of control circuit 9 to match the output of the identified electronic ballast.

The tuning circuit may then adjust the impedance of the biasing circuit based on the obtained desired impedance value. By way of example, the tuning circuit may selectively switch one or more variable capacitance arrangements or variable resistance arrangements in order to change the impedance value.

In this way, an identity of an electronic ballast may be determined, from the identifying signal, and used to determine impedance values or how to control a variable impedance arrangement of a control circuit 9.

In at least one preferable embodiment, the stored desired impedance values identify desired impedance values for particular values of the reference signal or for particular dimming levels indicating by the reference signal.

In other embodiments, the method 70 instead comprises directly controlling or calculating appropriate impedance values based on measured parameters of the electronic ballast. For example, impedance values may be directly dependent upon a frequency or voltage of a signal output by the electronic ballast. In one example, a frequency of a supply output by the electronic ballast is determined and used to define a location of the zeros and/or poles of the control circuit.

The control circuit 9 may further comprise a reference signal processor 72. The reference signal processor 72 is adapted to process the reference signal $S_R$ to determine whether to adjust the reference signal.

As previously discussed, the reference signal $S_R$ may indicate a desired dimming level of a LED light source. The present invention recognizes that particular dimming levels or desired dimming levels may cause a flicker of the LED light source for particular ballasts (e.g. due to incompatibility of the control circuit 9). Different ballasts may have an LED light flicker at different desired dimming levels. This is due to a relationship between the switching frequency of the switching performed by the lighting driver and the frequency of the output of the electronic ballast.

The reference signal processor may determine whether the reference signal is within a range around a predetermined value (i.e. a predetermined range). The predetermined value may be a value of the reference signal $S_R$ that causes the LED light source to flicker for a particular ballast. The reference signal $S_R$ may be modified to avoid a range around a predetermined value (e.g. skip the range) to prevent LED flicker.

By way of example, if a value of a reference signal lowers into a predetermined range, the reference signal processor may output a signal (to the second input 23) that is below the lower end of the predetermined range. Thus, if it is known that a reference signal having a value in the region of 0.60-0.70V causes flicker in the LED light source, if a reference signal lowers from 0.71V to 0.65V, the output of the reference signal processor may instead be 0.59V (thereby skipping the predetermined range).

The reference signal processor may output an unmodified reference signal $S_R$ if the value of the reference signal lies outside of the predetermined range. The reference signal processor may output a modified reference signal (lying outside of the predetermined range) if the reference signal lies within the predetermined range. The selection of the output modified reference signal may depend upon a previous history of the reference signal $S_R$. For example, if the reference signal was previously above the predetermined range, the output modified reference signal may be below the predetermined range and vice versa.

The predetermined value and/or predetermined range may vary depending upon the identity or other parameters of the electronic ballast. In one embodiment, the control circuit 9 determines an identity of the electronic ballast (e.g. using a method previously described) and the storage system 71 stores the predetermined value or range associated with each ballast. The reference signal processor may look-up the predetermined value for the currently identified ballast in the storage system.

Of course, the predetermined value may also depend upon an operation of the lighting driver and/or the LED light source driven by the lighting driver. This may be taken into account.

Thus proposed methods allow for the control circuit to avoid potentially problematic reference signals and/or dimming levels. Errors can thereby be quickly and simply avoided.

In a preferable embodiment, the control circuit 9 determines whether it is capable of suitably adjusting the impedance of the biasing circuit, using the tuning circuit 28, based on at least the identity of the electronic ballast. In response to the control circuit 9 determining that it is capable of suitably adjusting the impedance of the biasing circuit, the tuning circuit modifies the impedance of the biasing circuit appropriately and the reference signal processor does not adjust a value of the reference signal, e.g. when it falls within the predetermined range. In response to the tuning circuit determining that it is incapable of adjusting the impedance of the biasing circuit appropriately, the reference signal processor is adapted to adjust the value of the reference signal when it falls within a predetermined range.

Embodiments thereby increase the variety of electronic ballast for which an LED lighting arrangement may be compatible with, by avoiding operation at dimming levels which cause flicker or other undesirable effects.

The concept of a reference signal processor 72 may also be considered separately from embodiments comprising a biasing circuit having an adjustable impedance. That is, a concept proposes a control circuit comprising a reference signal processor to identify potentially problematic dimming levels, without the need for a biasing circuit 25 having an adjustable impedance and/or a tuning circuit 28.

To reduce a number of components, the reference signal processor 72 and tuning circuit 28 may be incorporating into a single processing arrangement, such as a CPU or MCU.

There is also herein proposed a concept of a detection arrangement adapted to determine characteristics of an electronic ballast. The detection arrangement may be formed separately from the control circuit(s) previously described, and may be formed as part of or separately to a lighting arrangement 1. The detection arrangement may act as the detection circuit for a lighting driver previously described, or for drivers of other lighting arrangements.

Components of LED-based lighting arrangements may have adjustable values in order to match differing output characteristics of an electronic ballast. Lighting arrangements may comprise one or more adjustable impedance arrangements comprising variable resistors, potentiometers, variable capacitors and/or variable inductors. Lighting arrangements may thereby have an adjustable impedance and/or frequency response, by controlling an impedance of the one or more adjustable impedance arrangements. Such lighting arrangements have an improved compatibility with electronic ballasts, as an impedance or frequency response of the lighting arrangement may be tuned to match a variety of different electronic ballasts.

Other settings of LED-based lighting arrangements (e.g. PWM operation and the like) may also depend upon characteristics of an electronic ballast connected thereto.

The electronic circuitry of a lighting arrangement might be re-programmable, or might be programmed only once in a specific state, e.g. by burning out particular electronic components.

There is therefore a desire to accurately determine output characteristics or parameters of an electronic ballast for the sake of compatibility with a measured electronic ballast. In particular, values of adjustable components of the lighting arrangement, such as components of an adjustable impedance arrangement, should be defined.

The previously described control circuit is one preferable embodiment of an adjustable impedance arrangement for a lighting arrangement. Other suitable adjustable impedance arrangements and/or lighting arrangements having an adjustable impedance would be well known to the skilled person. It is therefore clear that adjusting an impedance of the adjustable impedance arrangement may thereby adjust an impedance, a frequency response and/or a (range of) compatibility of a lighting arrangement.

Using a detection arrangement to identify output parameters of the electronic ballast and/or an identity of the electronic ballast enables appropriate component values for an adjustable impedance arrangement of a lighting arrangement to be readily calculated (e.g. in advance).

According to a concept, there is provided a detection arrangement for determining characteristics of an electronic ballast, wherein the detection arrangement comprises: a detection circuit adapted to determine values of output parameters of the ballast; and a first interface adapted to transmit an output signal based on the determined values of output parameters of the ballast, to an external device.

The output signal may otherwise be labelled an identifying signal of/for the electronic ballast. It will be clear that the output signal varies depending upon the type, model or identity of the electronic ballast to thereby identify the electric ballast and/or distinguish said electronic ballast from other electronic ballasts.

The proposed detection arrangement thereby comprises a detection circuit adapted to connect to an output of an electronic ballast and to detect, sense, obtain or record output parameters or characteristics of that electronic ballast. An output signal (i.e. an identifying signal) is generated based on the detected parameters or characteristics.

The output parameters may include, for example, an impedance, an output frequency, an output current, or an output voltage of the electronic ballast. The detection circuit may sense such parameters using, for example, any one or more of: electromagnetic sensors, capacitive sensors, transformers, voltmeters, ammeters, frequency detection circuits and so on. Other appropriate sensing arrangements will be readily apparent to the skilled person.

The detection arrangement may, in some embodiments, use standard lamp sockets (to connect to the electronic ballast) and preferably contains a wide spectrum of test and measurement circuitry and protocols configured to test and measure the electronic ballast of a luminaire to be tested.

These output characteristics may be used to determine suitable values for components of an adjustable impedance arrangement. For example, an impedance of the lighting arrangement may be tuned to match an impedance of the electronic ballast or an impedance of components may be altered to change a frequency response of the lighting driver (as herein described). This would improve an efficiency and reduce power consumption of the lighting arrangement, as well as prevent potential flicker of a light source of the lighting arrangement. Here the impedance may be the above discussed impedance related to the control loop of the lamp; alternatively, it may be the input impedance of the lamp as seen by the ballast. For example, it is possible to tune a series capacitance between the ballast and the lamp's converter so as to match the ballast.

Preferably, the detection circuit is adapted to detect a frequency and/or amplitude of a signal output by the electronic ballast. These characteristics of an electronic ballast have been identified as being the most relevant for determining a required impedance matching, prevention of flicker and appropriate frequency response of a lighting arrangement connected to the electronic ballast, and therefore may be used to best advantage.

The detection arrangement also comprises a first interface adapted to output, provide or otherwise supply, based on the detected output parameters, an output signal carrying identifying information of the electronic ballast. The first interface is further adapted to pass this output signal to an external device, such as the lighting arrangement, an intermediary device or an external server.

The output signal may be labelled an identifying signal. The first interface may pass the output signal to an external device using any known wired protocol, such as over an Ethernet or DALI connection, or a wireless protocol, such as WiFi, BlueTooth, 3G, ZigBee, 4G and so on.

In one embodiment, the transmitted output signal carries information about the determined values of the output parameters. The first interface may thereby act as a bridge to pass the values of the output parameters, detected by the detection circuit, to an external device. The values of the output parameters vary depending on a type, model or identity of the ballast and can thereby act as identifying information of the electronic ballast.

In some embodiments, the detection arrangement is adapted to determine an identity, model or type of the electronic ballast based on the output parameters. In particular, the detection arrangement may comprise a processor adapted to process the values of the determined output parameters to identify the electronic ballast.

The processor may identify the electronic ballast by comparing the determined output parameters of the electronic ballast to reference output parameters associated with different types, models or identities of respective reference electronic ballasts (e.g. using a database system). In some embodiments, a distance measurement between the determined output parameters and reference output parameters is generated by the processor. The model/type/identity of the reference electronic ballast having reference output parameters associated with the lowest distance measurement is selected as the model/type/identity of the measured electronic ballast.

The output signal transmitted by the first interface may thereby carry information that directly identifies a model/type/identity of the electronic ballast.

The detection arrangement may be adapted to determine suitable values for an adjustable impedance of a lighting arrangement (to be connected to the electronic ballast). In particular, the detection arrangement may comprise a processor adapted to process the values of the determined output parameters to identify suitable values for an adjustable impedance of a lighting arrangement.

The processor may be adapted to receive signals carrying identifying information of the electronic ballast and identifying information of a lighting arrangement. The processor may use the received information to determine suitable values for components of an adjustable impedance circuit of the lighting driver.

The identifying information of the lighting driver may comprise an identity or design of the lighting driver, a circuit layout of the lighting driver, an indication of the adjustable parameters of the lighting driver and so on.

The processor may use the information of the lighting arrangement (e.g. how an impedance of the lighting arrangement may be adjusted) to determine suitable values for the adjustable impedance of the lighting arrangement. For example, the identifying information of the lighting arrangement may detail or indicate what component values of the lighting arrangement may be adjusted and how this affects the impedance or frequency response of the overall lighting arrangement. This may be used to generate component values for tuning the lighting arrangement appropriately.

The identifying information of the lighting driver may be obtained, for example, from a user input which identifies the model, type or identity of the lighting driver and/or which indicates parameters of the lighting driver. Other methods of identifying or obtaining identifying information will be well-known to the skilled person (e.g. bar-code scanners, signals transmitted by the lighting driver and so on).

The detection arrangement may, in some embodiments, further comprise an LED emulation unit. The detection arrangement may thereby form a testing unit or testing device for more accurately detecting the output parameters of the electronic ballast in the context of a lighting arrangement to be connected to the electronic ballast.

The LED emulation unit is adapted to emulate an LED light source of a lighting arrangement. Some output parameters of an electronic ballast, such as an output voltage, may depend upon an impedance or type of a lighting arrangement. Using an LED emulation unit to simulate an LED light source thereby allows a detection arrangement to detect output parameters of the electronic ballast for a particular lighting arrangement.

This enables a more accurate and relevant determination of the output parameters of the electronic ballast in the context of a lighting arrangement to be connected to the light source. Thus, the output parameters of an electronic ballast may be more accurately and contextually characterized.

The LED emulation unit may comprise: at least one LED string; at least one LED string configuration for simulating particular LED configurations and/or at electronics to simulate various LED configurations (e.g. to simulate an impedance and/or frequency response of the LED light source). Thus, the LED emulation unit may comprise one or more LED strings and/or string configurations used to simulate particular LED configurations or may contain electronics to simulate various LED string configurations. Embodiments may thereby enable various lighting arrangement to be simulated by the detection arrangement (i.e. a variable testing device).

The LED emulation unit may have an adjustable impedance, power demand and/or other characteristics so as to enable the LED emulation unit to emulate different lighting arrangements and/or LED light sources.

The LED emulation unit may thereby emulate a lighting arrangement to be connected to the electronic ballast. A controller/processor may determine, based on the emulated lighting arrangement and the determined output characteristics of the electronic ballast, appropriate component values for an adjustable impedance of the lighting arrangement emulated by the LED emulation unit. Thus, values suitable for impedance matching of the lighting arrangement (e.g. values for capacitors, inductors or resistors) may be calculated. Such a calculation has improved accuracy and relevance, as the lighting arrangement may be accurately emulated.

A controller of the detection arrangement may be adapted to control, bias or tune the LED emulation unit to emulate a particular lighting arrangement. For example, a controller may receive identifying information of the lighting driver (e.g. via the first driver or a user input). This identifying information may be used to define characteristics, parameters, a circuit layout, a switch configuration, or component values of the LED emulation unit to match an identified lighting arrangement. This allows the LED emulation to represent or emulate various lighting arrangements.

Embodiments thereby advantageously allow for values for adjustable components of lighting arrangements to be determined before such lighting arrangements are connected to the electronic ballast (by using the LED emulation unit rather than the lighting arrangement itself). Thus, a lighting arrangement may be programmed or tuned when disconnected from an electronic ballast, allowing the lighting arrangement to be adapted before connection to the electronic ballast. This reduces a risk or cost of tuning the lighting arrangement for an electronic ballast (e.g. as specialist equipment need not be provided and tuning can be performed when the lighting arrangement is unpowered).

In particular, an installer may program a lighting arrangement before they are shipped to the location to be installed. This improves an ease of programming the lighting arrangement. Moreover, an installer may test (e.g. an appropriateness of) a lighting arrangement as a preparation for a replacement, such he can verify and/order the correct lighting arrangements in advance, reducing the chance that an incorrect or incompatible lighting arrangement will be installed.

Embodiments also enable a determination to be made as to whether a lighting arrangement is suitable or compatible with an electronic ballast before connection of the lighting arrangement to the electronic ballast. This reduces a likelihood that an incompatible lighting arrangement will be connected to an electronic ballast, reducing a potential damage to a lighting arrangement and/or reducing a length of time spent assessing a non-functional or incompatible lighting arrangement. Flicker and other undesirable characteristics may also be avoided.

The controller of the detection arrangement may be adapted to generate an indication of appropriate lighting drivers or lighting arrangements to be used with the electronic ballast. By way of example, the controller may determine that only lighting arrangements having certain characteristics or capabilities may operate with the electronic ballast (e.g. within a particular range of impedances or frequency responses). This may be performed by consulting a database or list of lighting arrangements and determining whether said lighting arrangements are suitable for an electronic ballast. Thus, the detection arrangement may be adapted to advise on particular types or models of lighting arrangement to be used with an electronic ballast.

The detection arrangement may, in some embodiments, comprise an LED light source (e.g. instead of the LED emulation unit). The detection arrangement may thereby form a lighting arrangement comprising a detection circuit. Thus, the detection arrangement may act as a lighting arrangement.

This may be advantageous to ensure that tuning of lighting arrangements can be performed after all lighting arrangements have been installed. For example, a power fluctuation in a building may affect the output of an electronic ballast, which can be detected by a detection arrangement (of a light) and used to appropriately bias all lighting arrangement in the vicinity (by outputting an appropriate identifying signal to said lighting arrangements).

Figure 9:
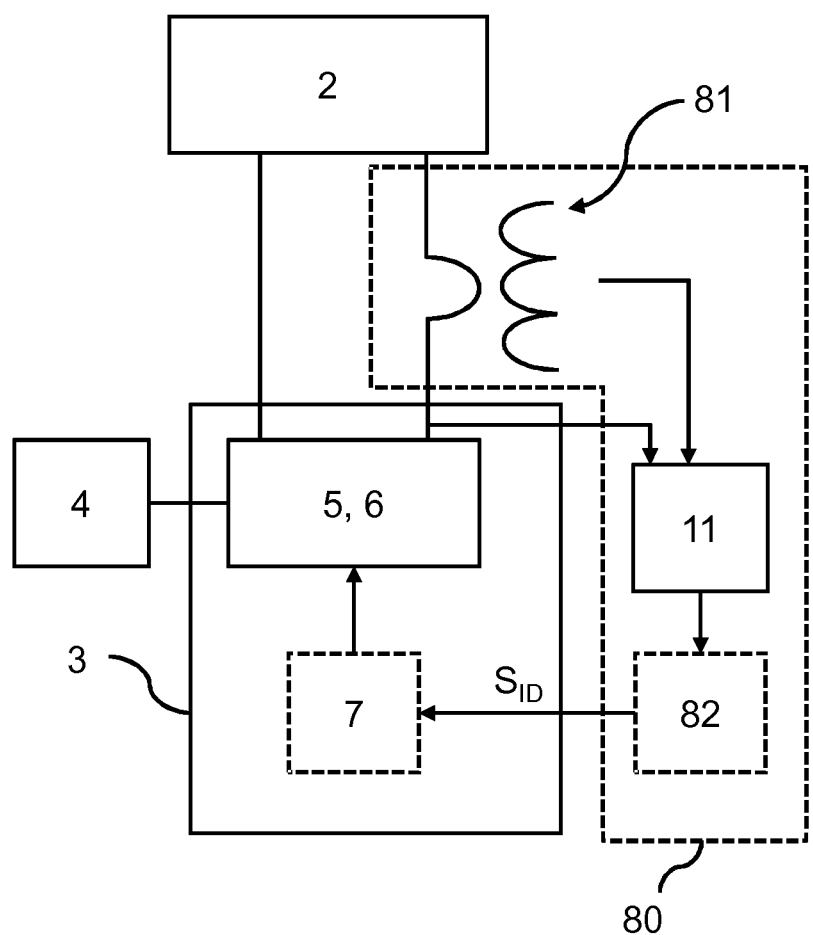
FIG. 9 illustrates a first detection arrangement.

FIG. 9 illustrates a detection arrangement 80 according to a first embodiment. The illustrated detection arrangement 80 is adapted for use with the control circuit/loop previously described. In particular, the illustrated detection circuit 11 is operable when the lighting driver 3 is "in situ", so that it is connected to the electronic ballast 2.

The detection arrangement 80 comprises a detection circuit 11 adapted to detect output characteristics of the electronic ballast 2 and a first interface 82 adapted to transmit an output signal or identifying signal $S_{ID}$ based on the detected output characteristics to an external device. Here, the external device is the lighting driver 3.

The detection circuit 11 is adapted to detect a current or frequency of the ballast 2 from an electromagnetic sensor 81 magnetically coupled to an output of the ballast 2. The detection circuit 11 also detects the voltage directly from the output of the ballast (e.g. using a known voltmeter connected between a differential output of the electric ballast). The first interface 82 is adapted to generate the identifying signal $S_{ID}$ (output signal) based on the detected characteristics of the electronic ballast.

The first interface 82 is adapted to communicate with both the detection circuit 11 and the lighting driver 3. The first interface 82 may thereby act as a bridge between the detection circuit 11 and the lighting driver 3. This provides a simple and secure method of communicating the identifying signal to the control loop 7.

The identifying signal $S_{ID}$ (output signal) carries information about the detected parameters of the electronic ballast 2. For example, the identifying signal $S_{ID}$ may comprise an encoded datastream which identifies measured values of various parameters of the ballast. In other embodiments, the identifying signal may be a simple voltage level indicating a detected frequency of the electronic ballast.

Various other embodiments for passing the detected information to the lighting driver 3 will be readily apparent to the skilled person.

The lighting driver 3 or control loop 7 may comprise a complimentary interface or communication module adapted to communicate with the first interface 82.

A single detection arrangement 80 may obtain electronic ballast parameters for use in a plurality of different lighting arrangements. For example, it may be assumed that all electronic ballasts in a same building, room or location are identical models with identical output characteristics. The present invention recognizes that only a single detection arrangement 80 (and thereby single detection circuit 11) need be provided to identify each electronic ballast.

The first interface 82 may therefore communicate with a plurality of different lighting arrangements/drivers, and pass the identifying signal $S_{ID}$ to each of these lighting arrangement/drivers. Thus, identifying information of an electronic ballast may be simultaneously generated for a plurality of lighting drivers/arrangements.

Thus, a cost of lighting arrangements may be reduced by providing a single separate detection circuit or arrangement (which may communicate with the said lighting arrangements) to determine characteristics of the ballast, rather than each lighting arrangement comprising a detection circuit. The single detection circuit may communicate with each of the lighting arrangements to enable the lighting arrangement to modify an impedance of the driver and/or LED light source so as to match the electronic ballast.

Figure 10:
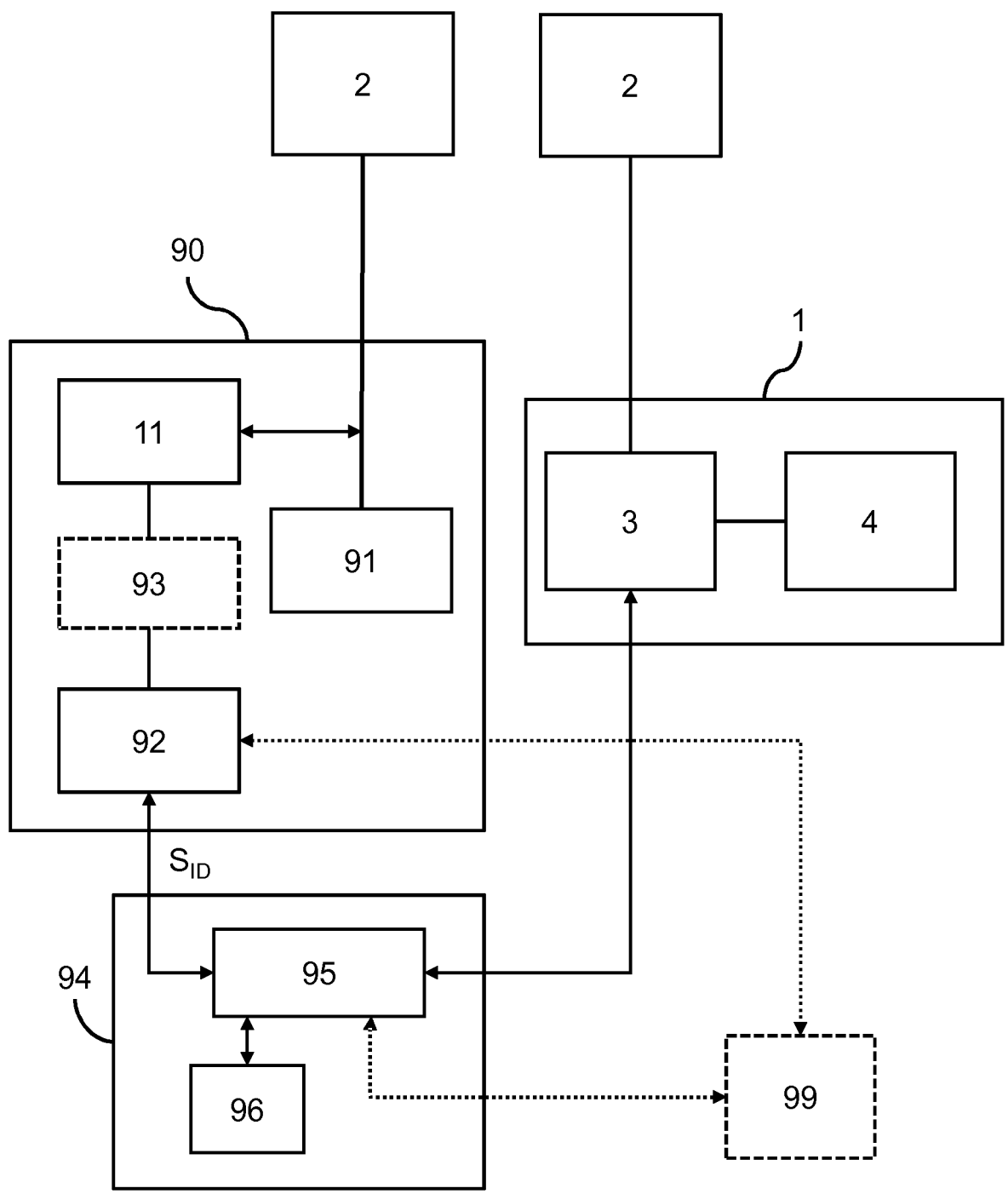
FIG. 10 illustrates a second detection arrangement.

FIG. 10 illustrates a second embodiment of the detection circuit 90 according to a more general concept. The detection circuit is adapted to detect output characteristics of an electronic ballast 2.

The detection arrangement 90 comprises a detection circuit 11, an LED emulation unit 91 and a first interface 92. The detection arrangement 90 thereby forms a testing device or testing unit.

The LED emulation unit 91 is adapted to emulate an LED light source of a lighting arrangement 1 which may be connected to the electronic ballast 2. The lighting arrangement 1 comprise a lighting driver 3 and a LED light source 4.

The first interface 92 is adapted to output, transmit or pass an output signal $S_{ID}$ (also called an identifying signal) to an external device. The first interface 92 thereby communicates with a device external to the testing device, such as a lighting driver 3 of another lamp directly, or with an intermediary device 94, a server 99 or a storage device (not shown).

The output signal $S_{ID}$ comprises identifying information of the electronic ballast 2 based on the detected operating parameters of the electronic ballast.

The aim of the detection arrangement (formed as a testing device) is to avoid the need for a lighting driver or lighting arrangement like lamp 1, having one or more components with an adjustable impedance for ballast compatibility, to comprise a dedicated detection circuit. Rather, a single testing device may emulate various lighting drivers/arrangement for different electronic ballasts.

Thus, the detection arrangement 90 (embodied as a testing device) is adapted to emulate one or more types of lighting arrangement using the LED emulation unit 91 in order to obtain operating parameters of an electronic ballast in the context of a particular lighting arrangement.

The first interface 92 may thereby transmit an output signal $S_{ID}$ carrying information about output characteristics of the electronic ballast when powering a simulated lighting arrangement.

In other embodiments, the detection circuit further comprises a controller 93 adapted to determine a model, type or identity of the ballast from the detected parameters. The first interface 92 may thereby transmit an output signal $S_{ID}$ which carries information indicating the model, type, or identity information. This may be performed according to any method previously described (e.g. consulting a database or communicating with an external server). This embodiment would require a storage and a comparing component to map the detected parameters with pre-stored data, as discussed above. In some embodiments, the controller 93 may communicate with an external server 99, upload the detected parameters of the electronic ballast and receive the model/identity of the electronic ballast or appropriate parameters for the biasing circuit or other impedance matching circuit of the lighting driver. Thus, the external server 99 may provide additional processing power and/or storage capabilities to the detection arrangement 90.

In yet other embodiments, the detection circuit comprises a controller 93 adapted to determine suitable values for components of an adjustable impedance arrangement of a lighting arrangement like lamp 1. This could be performed by searching for pre-stored values which match each model, type or identity of the ballast. This could be also be performed by changing the values for components in the test lamp, detecting the output current and checking whether there is flicker/disturbance in the LED current, and taking the value with least disturbance.

Therefore, the output signal $S_{ID}$ transmitted by the first interface may carry identifying information which indicates:
  detected parameters of the electronic ballast,
  a model or identity of the electronic ballast, and/or
  already determined suitable values for components of an adjustable impedance circuit of a lighting driver.

In this way, parameters of an adjustable impedance arrangement of the lighting arrangement may be appropriately tuned without requiring a separate or dedicated analysis by the lighting driver. Thus, a number of dedicated components in a lighting arrangement may be significantly reduced (as they need not comprise a detection circuit).

According to a concept, there is provided an intermediary device 94 comprising an interface 95 adapted to receive the output signal $S_{ID}$ from the detection arrangement 90; a controller 96 adapted to process the output signal. The interface is further adapted to transmit the processed output signal to a lighting arrangement, for example, in the form of a processed output signal. The interface 95 may be an NFC interface.

The intermediary device 94 may act to provide supplementary storage or processing power, abilities or efficiency to the testing device 90, analogously to the external server 99. Thus, the controller 96 may perform any one or more of the operations of the controller 93 of the testing device 90.

For example, the controller 96 may be adapted to determine the model, type or identity of the ballast from the detected parameters of the electronic ballast or determine suitable values for components of an adjustable impedance circuit of a lighting arrangement. In some examples, the controller 93 of the testing device 9 may be omitted, with all processing being performed by the processor 96 of the intermediary device.

The intermediary device may comprise a storage system (not shown) adapted to store the identifying information or the processed identifying information.

The intermediary device may be a consumer electronic device running a particular program or application. Examples of a consumer electronic device include: portable computers, notebooks, tablets, smartphones or similar devices. This advantageously allows the intermediary device to be remotely upgraded (e.g. performing an application update) to reflect improved test and/or measurement protocols and/or impedance value calculation methodologies.

The interface 95 may communicate with the detection arrangement 90 or lighting arrangement 1 using any known wired or wireless protocol.

In particular embodiments, the intermediary device 94 may act as a programming device for programming or tuning an adjustable impedance circuit of the lighting driver 3. By way of example, the intermediary device 94 may upload the desired settings (i.e. the suitable values for an adjustable impedance arrangement) to the lighting arrangement 1 via the interface 95.

Preferably, the intermediary device 94 may communicate with the lighting arrangement via power end caps of the lighting arrangement 1, such as those present in a tubular LED lighting arrangement. This enables wireless interface electronics to be omitted and the cost of a lighting arrangement to be minimized. Preferably, the intermediary device 94 communicates with the lighting arrangement via an NFC tag/reader located at the power end caps of the lighting arrangement.

The interface 95 may also or otherwise comprise a phone connector, jack plug or headphone output jack which is configured and/or controlled so as to communicate all information including the processed identifying information and/or receive the identifying information $S_{ID}$, and communicate the suitable values for components in the lighting arrangement 1. The interface 95 may be connected to the testing device 90 and/or the lighting driver 3 via a wired connector or adapter.

By way of example, the lighting driver may be able to communicate using an interface operable under the Digital Addressable Lighting Interface (DALI) protocol. The interface 95, comprising a phone connector, of the intermediary device may connect to the lighting driver over an adapter which converts the phone connector output to a DALI interface.

Providing a method of communicating with a lighting driver using an interface having a phone connector extends the compatibility of the intermediary device to a greater number of existing consumer products (i.e. more consumer products may act as the intermediary device). This may reduce the cost and improve efficiency of adjusting an impedance of an adjustable impedance circuit of a lighting driver or lighting arrangement. Moreover, the embodiment enables the programming of the lighting arrangement to occur without dedicated power provisions like a main power supply or batteries.

Moreover, such methods prevent the need for a lighting driver and/or detection arrangement to comprise wireless communication capabilities. Thus, a size and/or cost of the lighting driver and/or detection arrangement may be significantly reduced.

The interface 95 may similarly be adapted to communicate with the detection circuit 90 using a same adapter and/or protocol.

Of course, in some embodiments, the first interface 92 is adapted to perform the previously described actions of the interface 95 (e.g. directly communicate with the lighting arrangement 1), so that the intermediary device may be omitted. The detection arrangement 90 may thereby directly communicate with the lighting arrangement 1, using any communication protocol, methodology or apparatus, such as a headphone jack, previously described.

In some embodiments, the intermediary device 94 may upload the detected parameter(s) to an external server 99 and receive the model/identity of the electronic ballast or appropriate parameters for the biasing circuit or other impedance matching circuit of the lighting driver. Thus, the external server 99 may provide additional processing power and/or storage capabilities to the intermediary device 94.

In another embodiment, the programming device is provided as a separate entity to the intermediary device and/or detection arrangement. Thus, the intermediary device and/or detection arrangement may further pass the processed identifying information to a programming device (e.g. the suitable values for components of a lighting arrangement). The programming device may subsequently communicate with the lighting arrangement (e.g. using a direct wired connection, such as a DALI connection) to control or define parameters of the lighting driver and/or lighting arrangement.

Such a programming device may contain a wireless or wired communication interface to communicate with the intermediary device and/or the detection arrangement.

The programming device may be specifically adapted for programming the lighting arrangement, e.g. defining impedance values of components of the lighting arrangement. The programming device may, in embodiments, be unable to calculate the suitable values (rather, this may only be performed by the detection arrangement and/or the intermediary device).

There is also proposed a concept of a lighting driver 3 adapted to drive an LED light source 4 from a ballast 2. The lighting driver comprises a second interface adapted to receive identifying information of the ballast, and a tuning circuit adapted to tune the driver based on the received identifying information.

The identifying information may be received, for example, from the testing circuit and/or the intermediary devices previously described. The received identifying information may therefore comprise the identifying information which has been processed by the intermediary device.

Preferably, the driver comprises an impedance matching circuit which is connected between the LED light source and the ballast, and/or a control loop (such as those previously described) for controllably connecting the ballast to the LED light source. The controller is adapted to modify the impedance of the impedance matching circuit and/or the control loop based on the received identifying information.

In particular, the received identifying information may comprise values for the impedance match circuit and/or values for components of the control loop. The controller may thereby tune components of the lighting driver according to received.

In a slightly modified embodiment, the LED emulation unit may comprise a lighting driver and a LED light source, such as those previously described.

Figure 11:
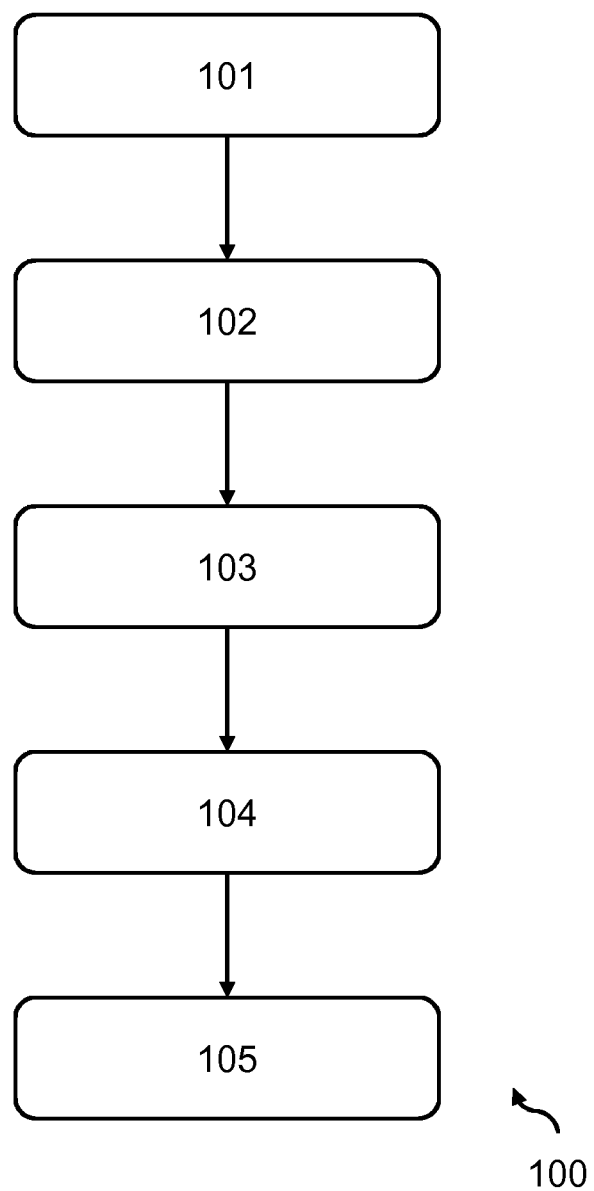
FIG. 11 illustrates a control method according to an embodiment.

FIG. 11 illustrates a control method for a lighting driver according to an embodiment, wherein the lighting driver is adapted to controllably connect an output of an electronic ballast to an LED light source.

The control method comprises a step 101 of receiving, at a first input of a differential amplifier, a sensing signal indicative of a current of a signal at the output of the electronic ballast.

The control method further comprises a step 102 of receiving, at a second input of the differential amplifier, a reference signal; and a step 103 of outputting, from an output of the differential amplifier, a control signal, wherein the control signal is an amplification of a voltage difference between the first and second input.

The control method 100 further comprises a step 104 of controlling the connection of the output of the electronic ballast to the LED light source using the control signal; and a step 105 of adjusting an impedance of a biasing circuit, having an adjustable impedance and connected to at least one input of the differential amplifier, so as to adjust the control signal and thereby tune as least one of a gain crossover frequency, a gain margin, a phase crossover frequency and a phase margin of the control circuit and thereby of the control loop of the lighting driver.

The method may be carried out by a control circuit, which acts as a controller.

The controller can be implemented in numerous ways, with software and/or hardware, to perform the various functions required. A processor is one example of a controller which employs one or more microprocessors that may be programmed using software (e.g., microcode) to perform the required functions. A controller may however be implemented with or without employing a processor, and also may be implemented as a combination of dedicated hardware to perform some functions and a processor (e.g., one or more programmed microprocessors and associated circuitry) to perform other functions.

Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media such as volatile and non-volatile computer memory such as RAM, PROM, EPROM, and EEPROM. The storage media may be encoded with one or more programs that, when executed on one or more processors and/or controllers, perform the required functions. Various storage media may be fixed within a processor or controller or may be transportable, such that the one or more programs stored thereon can be loaded into a processor or controller.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A control circuit for a control loop of a lighting driver adapted to controllably connect an output of an electronic ballast to an LED light source, the control circuit comprising:
    a differential amplifier comprising:
        a first input adapted to receive a sensing signal ($S_S$) indicative of a current signal output to the LED light source;
        a second input adapted to receive a reference signal ($S_R$); and
        an output adapted to output a control signal ($S_C$), wherein the control signal is an amplification of a difference between the first and second inputs and wherein the control signal is for controlling the connection of the output of the electronic ballast to the LED light source;
    a biasing circuit connected to at least one input of the differential amplifier, wherein the biasing circuit has an adjustable impedance;
    an input to a detection circuit to obtain identifying information of the electronic ballast, said identifying information identifying a model, type or an identity of the electronic ballast; and
    a tuning circuit adapted to adjust the impedance of the biasing circuit based on the identifying information identifying the model, type or identity of the electronic ballast so as to tune at least one of a gain crossover frequency, a gain margin, a phase crossover frequency and a phase margin of the control circuit and thereby of the control loop of the lighting driver.

2. The control circuit of claim 1, wherein the biasing circuit comprises a feedback circuit connected between the output and at least one input of the differential amplifier.

3. The control circuit of claim 2, wherein the feedback circuit comprises an adjustable capacitance circuit, wherein the tuning circuit is adapted to adjust a capacitance of the adjustable capacitance circuit to thereby change a location of a first pole of the gain response of the differential amplifier to thereby change the gain margin and the phase margin of the control circuit.

4. The control circuit of claim 3, wherein the feedback circuit further comprises, in parallel with the adjustable capacitance circuit, a fixed capacitance circuit and an adjustable resistance circuit connected in series;
    wherein the tuning circuit is adapted to adjust a resistance of the adjustable resistance circuit to thereby change the location of a first zero point and a second pole of a gain curve of the differential amplifier to thereby change the phase margin and the gain margin of the control circuit.

5. The control circuit of claim 1, wherein the biasing circuit comprises a second adjustable resistance arrangement connected to at least one input of the differential amplifier and unconnected from the output of the differential amplifier,
    wherein the tuning circuit is adapted to adjust a resistance of the adjustable resistance arrangement to thereby adjust the gain of the differential amplifier to thereby change the phase margin and the gain margin of the control circuit.

6. The control circuit of claim 1, wherein the tuning circuit is adapted to adjust the impedance of the biasing circuit such that at least one of:
    the gain margin of the lighting driver used with the electronic ballast is no less than 10 dB;
    the phase margin of the lighting driver used with the electronic ballast is no less than 60 degrees;
    the phase crossover frequency of the lighting driver used with the electronic ballast is no less than half a switching frequency of the lighting driver.

7. The control circuit of claim 1, wherein the differential amplifier and the tuning circuit are arranged to form one of a type-II compensation arrangement or a type-III compensation arrangement.

8. The control circuit of claim 7, wherein the differential amplifier and the tuning circuit are arranged to form a type-III compensation arrangement and the tuning circuit further comprises:
    an input impedance circuit connected to at least one input of the differential amplifier, wherein the input impedance circuit is adapted to have an adjustable capacitance,
    wherein said input impedance circuit is adapted to be tuned by the tuning circuit to adjust a zero and a pole of the gain curve of the differential amplifier so as to adjust the phase margin of the control circuit.

9. The lighting driver according to claim 8, wherein the control circuit is adapted to avoid operating in accordance with a predetermined point or level of the reference signal.

10. A lighting arrangement, comprising the lighting driver of claim 8, further comprises the detection circuit and an LED light source, wherein the detection circuit is adapted to detect at least one of a current, frequency and voltage of a signal at the output of the electronic ballast, wherein the tuning circuit is adapted to adjust the impedance of the biasing circuit based on the at least one detected current, frequency and voltage.

11. The lighting arrangement of claim 10, wherein:
    the detection circuit is adapted to obtain the identifying information of the electronic ballast using the at least one detected current, frequency and voltage, wherein the electronic ballast is used with fluorescent or halogen lamps;
    the control circuit further comprises a storage device that maps possible identities of the electronic ballast to desired impedance values of the biasing circuit;
    the tuning circuit is adapted to adjust the impedance of the biasing circuit based on a desired impedance value that is mapped by the storage device to the identity of the electronic ballast identified by the control circuit.

12. A lighting driver, including the control circuit for a control loop to controllably connect the output of the electronic ballast to the LED light source according to claim 1, the lighting driver comprising:
    the control loop comprising:
        the sensing circuit adapted to generate a sensing signal ($S_S$) indicative of a current signal output to the LED light source from the electronic ballast;
        the control circuit coupled to the sensing circuit;
        a PWM circuit coupled to the control circuit and adapted to generate a PWM signal ($S_{PWM}$) based on the output of the control circuit; and
        a switching circuit adapted to controllably connect the output of the electronic ballast to the LED light source in accordance with the PWM signal.

13. The lighting driver according to claim 12, wherein a frequency response of the overall control loop of the lighting driver is formed from a combination of a frequency response of the control loop, excluding the control circuit, used with the electronic ballast and a frequency response of the control circuit.

14. A control method for control loop of a lighting driver adapted to controllably connect an output of an electronic ballast to an LED light source, the control method comprising:
    receiving, at a first input of a differential amplifier, a sensing signal indicative of a current of a signal at the output of the electronic ballast; and
    receiving, at a second input of the differential amplifier, a reference signal; and
    outputting, from an output of the differential amplifier, a control signal, wherein the control signal is an amplification of a voltage difference between the first and second input; and
    controlling the connection of the output of the electronic ballast to the LED light source using the control signal;
    the control method further comprising:
    obtaining identifying information of the electronic ballast, said identifying information identifying a model, type or an identity of the electronic ballast;
    adjusting an impedance of a biasing circuit, having an adjustable impedance and connected to at least one input of the differential amplifier, based on the identifying information identifying the model, type or identity of the electronic ballast, so as to adjust the control signal and thereby tune as least one of a gain crossover frequency, a gain margin, a phase crossover frequency and a phase margin of the control circuit and thereby of the control loop of the lighting driver.

15. A processor readable storage medium having processor readable program instructions embodied therewith to, when executed on a processor arrangement, cause said processor arrangement to implement the method of claim 14.

* * * * *